(12) United States Patent
Shen et al.

(10) Patent No.: US 8,341,490 B2
(45) Date of Patent: *Dec. 25, 2012

(54) VIRTUAL LIMITED BUFFER MODIFICATION FOR RATE MATCHING

(75) Inventors: Ba-Zhong Shen, Irvine, CA (US); Sirikiat Lek Ariyavisitakul, Alpharetta, GA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/429,553

(22) Filed: Mar. 26, 2012

(65) Prior Publication Data

US 2012/0195398 A1     Aug. 2, 2012

Related U.S. Application Data

(63) Continuation of application No. 12/362,543, filed on Jan. 30, 2009, now Pat. No. 8,145,974.

(60) Provisional application No. 61/025,769, filed on Feb. 2, 2008, provisional application No. 61/028,346, filed on Feb. 13, 2008.

(51) Int. Cl.
*H03M 13/00* (2006.01)

(52) U.S. Cl. ........................... 714/755; 714/790

(58) Field of Classification Search .................. 714/790, 714/755
See application file for complete search history.

(56) References Cited

U.S. PATENT DOCUMENTS

| 7,305,593 | B2 * | 12/2007 | Andreev et al. | 714/701 |
| 2006/0104378 | A1 * | 5/2006 | Allpress et al. | 375/261 |
| 2007/0071140 | A1 * | 3/2007 | Sontowski | 375/341 |

* cited by examiner

*Primary Examiner* — M. Mujtaba K Chaudry
(74) *Attorney, Agent, or Firm* — Garlick & Markison; Shayne X. Short

(57) ABSTRACT

Virtual limited buffer modification for rate matching. A reduced-size memory module is employed within a communication device to assist in storage of log-likelihood ratios (LLRs) employed in accordance with turbo decoding. This architecture is also applicable to other types of error correction code (ECC) besides turbo code as well. The memory size is selected to match the number of coded bits (e.g., including information bits and redundancy/parity bits) that is included within a transmission. The received signals may be various transmissions made in accordance with hybrid automatic repeat request (HARQ) transmissions. When the LLRs calculated from a first HARQ transmission is insufficient to decode, those LLRs are selectively stored in the memory module. When LLRs corresponding to a second HARQ transmission is received, LLRs corresponding to both the first HARQ transmission and the second HARQ transmission are passed from the memory module for joint use in decoding.

20 Claims, 21 Drawing Sheets

FBRM: rate 0.8 for one transmission (3 re-transmission), 64 QAM, AWGN

FBRM: rate 0.9 for one transmission (3 re-transmission), 64 QAM, AWGN

LBRM (50%): rate 2/3 for one transmission (3 re-transmission), 64 QAM, AWGN

US 8,341,490 B2

VIRTUAL LIMITED BUFFER MODIFICATION FOR RATE MATCHING

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 12/362,543, entitled "Virtual limited buffer modification for rate matching," filed Jan. 30, 2009, and scheduled to be issued as U.S. Pat. No. 8,145,974 on Mar. 27, 2012 (as indicated in an ISSUE NOTIFICATION mailed on Mar. 7, 2012), which claims priority pursuant to 35 U.S.C. §119(e) to the following U.S. Provisional Patent Applications which are hereby incorporated herein by reference in their entirety and made part of the present U.S. Utility patent application for all purposes:

a. U.S. Provisional Patent Application Ser. No. 61/025,769, entitled "Redundancy version starting position calculation," filed Feb. 2, 2008, now expired.

b. U.S. Provisional Application Ser. No. 61/028,346, entitled "Virtual limited buffer modification for rate matching," filed Feb. 13, 2008, now expired.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the highest theoretically possible data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

DETAILED DESCRIPTION OF THE INVENTION

Figure 1:
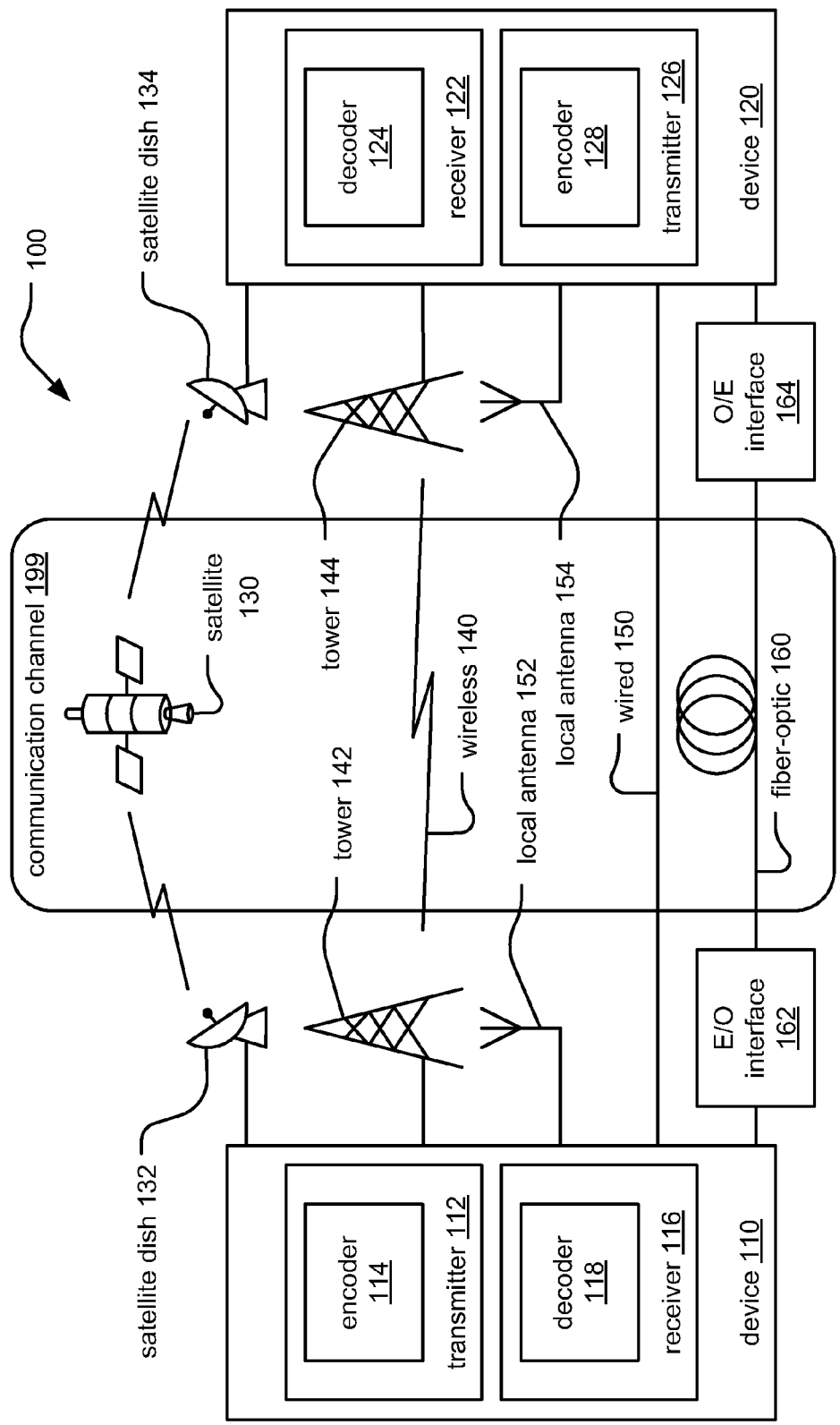
FIG. 1 and FIG. 2 illustrate various embodiments of communication systems.

Many communication systems incorporate the use of a turbo code. There are many potential applications that can employ turbo codes, and the means presented herein can be generally applied to any of those turbo code systems. In one particular embodiment, the means presented herein can also be applied to the 3GPP (3rd Generation Partnership Project) channel code to support an arbitrary number of information bits.

Additional information regarding the UTRA-UTRAN (Universal Terrestrial Radio Access-Universal Terrestrial Radio Access Network) Long Term Evolution (LTE) and 3GPP System Architecture Evolution (SAE) can be found at the following Internet web site:

www.3gpp.org

Turbo coding is employed for 3GPP LTE channel coding. Within the channel coding system in 3GPP LTE, there is a need and desire to supply and provide for a wide range of block sizes (i.e., turbo code block lengths). For this coding system, the "quadratic polynomial permutation (QPP)" interleave has been selected.

Furthermore, the turbo decoding of this system generally needs to be implemented using a parallel decoding arrangement because of the very high data throughput and large block size desired for 3GPP LTE channel coding. The parallel decoding requires the collision-free memory accessing (i.e., any one turbo decoder (of a group of parallel arranged turbo decoders) accesses only memory (of a group of parallel arranged memories) at any given time).

One of the ongoing issues in accordance with the development of 3GPP LTE channel coding is that corresponding to limited rate matching (LBRM) and the associated RV (redundancy version) starting position employed for each individual and successive transmission (as referred to in reference [1]).

The current definition of the (RV) redundancy version starting position calculation is described in reference [2] and is based on the virtual circular buffer (VCB). This current definition of the RV starting position calculation, as employed based on the VCB, varies as a function of the size of the sub-block interleave (as referred to in reference [3]). In this current definition, the RV starting position calculation varies as a function of the variable, R, which is the row number in the matrix used for sub-block interleaver.

$$k_0 = R \cdot \left(2 \cdot \left\lceil \frac{N_{cb}}{8R} \right\rceil \cdot rv_{idx} + 2\right) \quad \text{equation (1)}$$

where $N_{cb}$ is the VCB size of one turbo code.

One of the issues which leads to even more complexity is that fact that this computation involves division of variable number R, where R is the number of rows in the matrix used for sub-block interleaver.

A novel means of performing RV starting position calculation is presented herein as follows:

$$k_0 = \left\lceil \frac{N_{cb}}{4} \right\rceil \cdot rv_{idx} + 2R, \text{ or} \quad \text{equation (2)}$$

$$k_0 = \left\lceil \frac{N_{cb}^r}{4} \right\rceil \cdot rv_{idx} + 2R$$

$rv_{idx}$ the redundancy version number for this transmission.

It is noted that this equation (2) can be employed using either the value, $N_{cb}$, which corresponds to the size of the virtual circular buffer (VCB) of one turbo code or the value, $N_{cb}^r$, which is the size of a real buffer that includes no fill bits (e.g., as may be required for QPP interleaving) and no dummy bits (e.g., as may be required for sub-block interleaving).

As can be seen, there is no division with the variable number, R. The only division performed in this equation is by a fixed number (i.e., 4), and this can be implemented via a shifting operation with much less complexity than dealing with a variable number (e.g., R).

Later, performance diagram simulations are provided comparing a system employing the current RV starting position calculation of equation (1) and a system employing the novel RV starting position calculation of equation (2).

As can be seen in these diagrams, there is no performance loss by using the new formula [equation (2)] when employing either FBRM (full buffer rate matching) or LBRM (limited buffer rate matching).

From another perspective, the pseudo-code employed for LBRM as described in reference [2] implies that the limited buffer employed (or full buffer when the limitation is beyond the rate ⅓ buffer size) is a virtual buffer such that buffer may contain fill bits employed for QPP interleave (e.g., to ensure the block size is one of the possible QPP interleave sizes) and dummy bits employed for the sub-block interleave.

When the base station (e.g., eNB) sends out a coded block to a mobile station or user equipment (UE), the base station either needs to perform de-padding before sending out the coded block, or it needs to modify the starting position (e.g., via an additional RV starting position calculation) based on the de-padding that is performed after the RV starting position calculation has been performed.

Moreover, in some embodiments, a relatively large amount of memory can some required on both the base station (e.g., eNB) and mobile station (e.g., UE) sides of a communication link since the employed fill bits (e.g., employed for the QPP interleave) and the dummy bits (e.g., employed for the sub-block interleaving) never are transmitted, yet they nonetheless need to be processed, stored, and employed so that the RV starting position calculation can be performed properly in accordance with the current definition employed within equation (1).

For example, when considering Category 5, a memory of at least 11,200 soft log likelihood ratios (LLRs) will be wasted, since there are 25 turbo codes in one TB (transport block) and at least 28 dummy bits are needed for each and every subblock interleave. Herein, a novel means is also presented to modify the current procedure presented in reference [2], so that no memory is wasted in accordance with the currently proposed means of performing RV starting position calculation.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
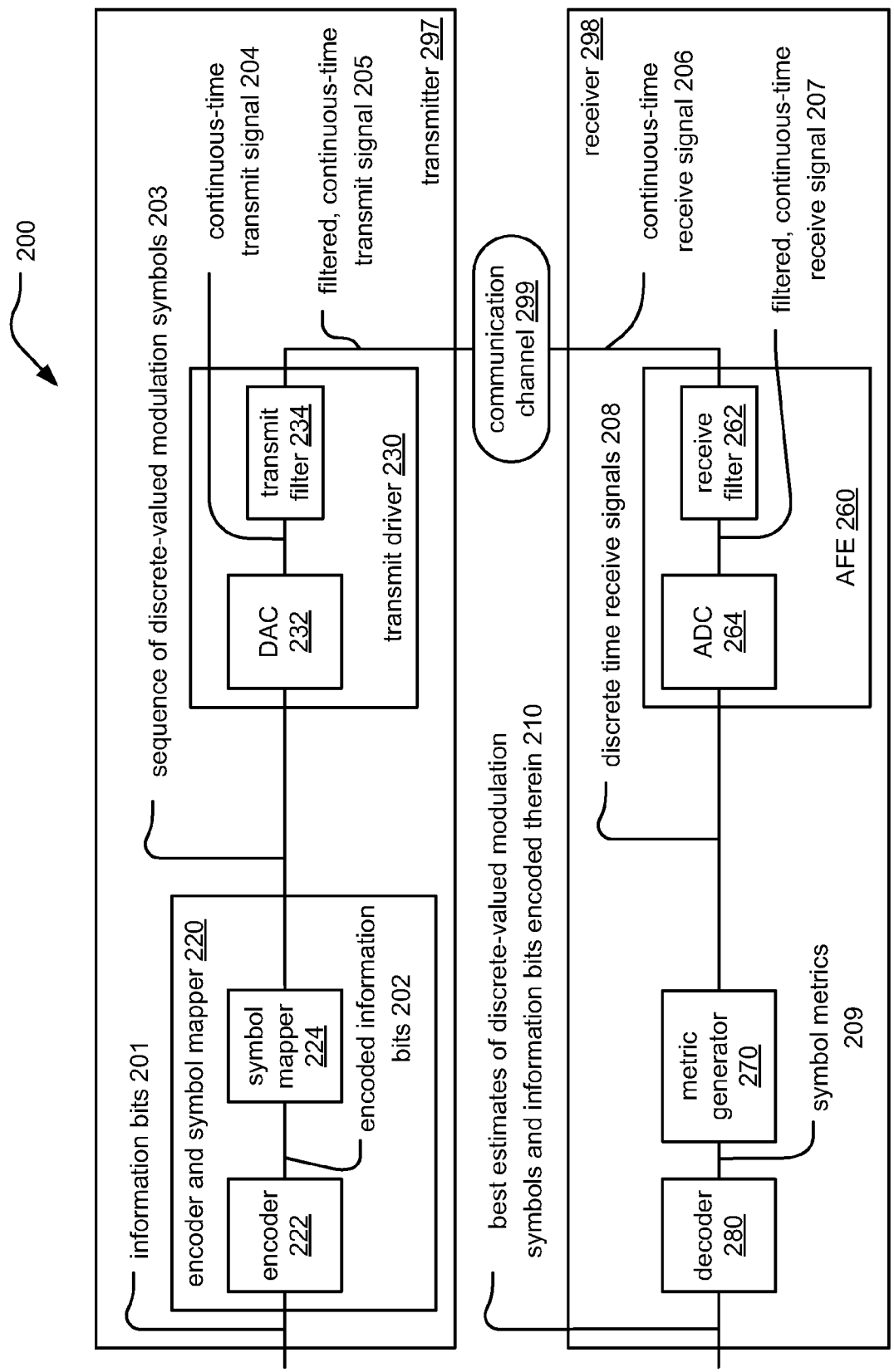

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented using a parallel decoding design and/or architecture in which multiple decoders are implemented to operate in conjunction with one another to effectuate faster decoding processing in accordance with parallel computing.

In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is a turbo coded signal.

Figure 3:
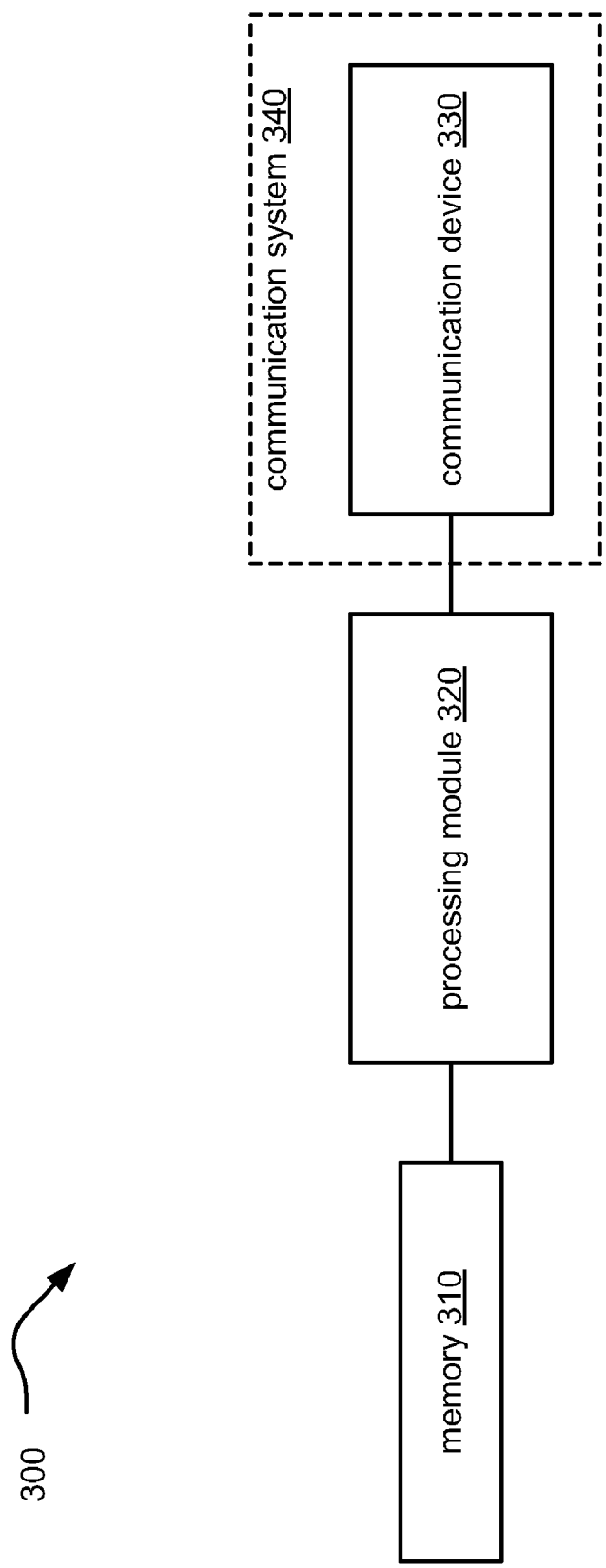
FIG. 3 illustrates an embodiment of an apparatus that is operable to perform turbo encoding and/or decoding processing.

FIG. 3 illustrates an embodiment of an apparatus 300 that is operable to perform turbo encoding and/or decoding processing. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which turbo encoding and/or decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the turbo encoding and/or decoding processing is to be performed can be provided from the apparatus 300 to a communication system 340 that is operable to employ and perform turbo encoding and/or decoding using a desired turbo code. For example, information corresponding to the turbo code being used (e.g., the code rate, block size, interleave, fill bits, pad bits, dummy bits, rate matching, etc.) can also be provided from the processing module 320 to any of a variety of communication devices 330 implemented within the communication system 340 as well. In addition, the manner in which such turbo encoding and/or decoding is to be performed within any of a variety of communication devices 330 implemented within the communication system 340 can also be provided from the processing module 320.

If desired, the apparatus 320 can be designed to generate multiple means of performing turbo encoding and/or decoding in accordance with multiple needs and/or desires as well. In some embodiments, the processing module 320 can selectively provide different information (e.g., corresponding to different turbo codes, code rates, interleaves, block sizes, fill bits, pad bits, dummy bits, rate matching, etc.) to different communication devices and/or communication systems. That way, different communication links between different communication devices can employ different turbo codes and/or means by which to perform turbo encoding and/or decoding. Clearly, the processing module 320 can also provide the same information to each of different communication devices and/or communication systems as well without departing from the scope and spirit of the invention.

Figure 4:
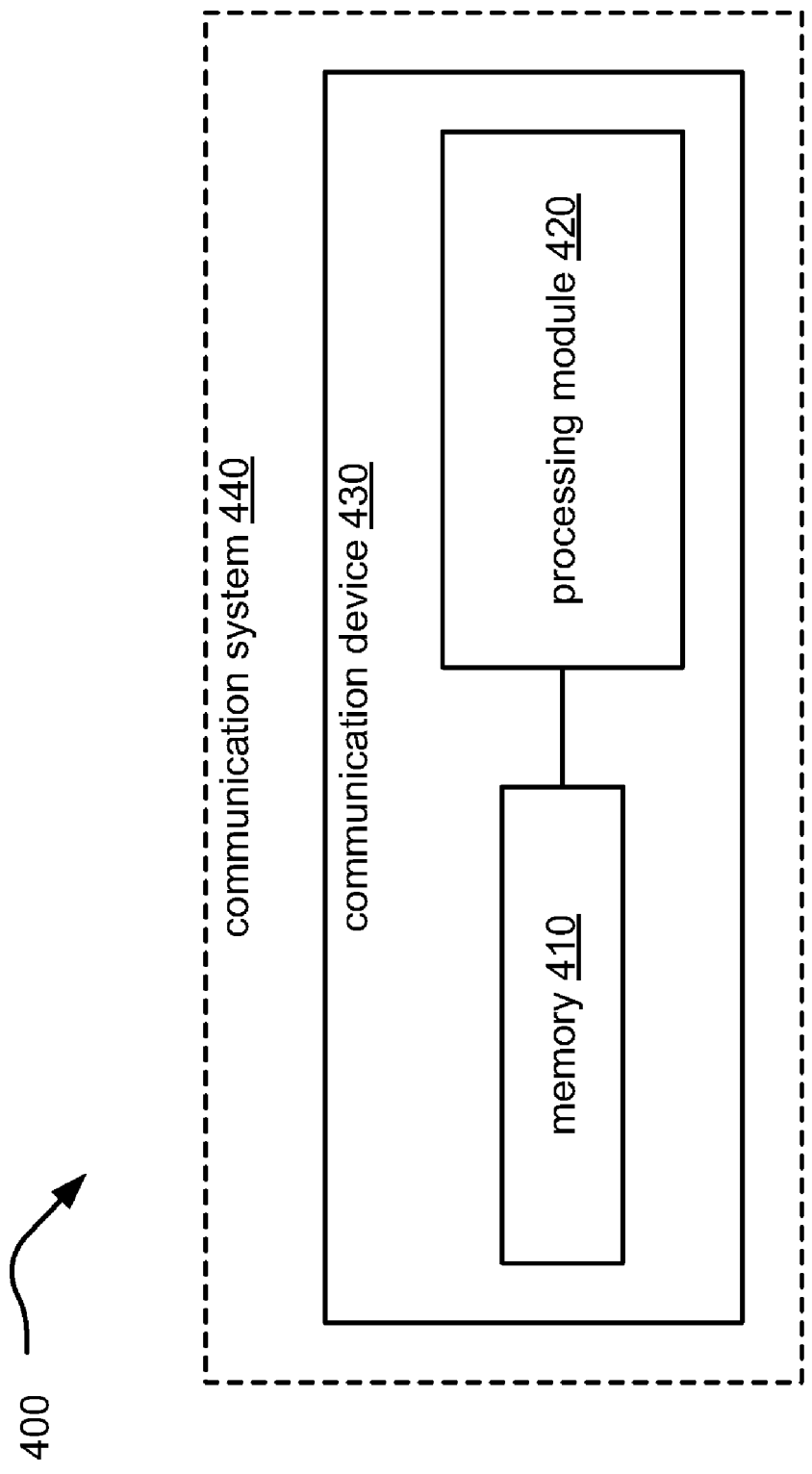
FIG. 4 illustrates an alternative embodiment of an apparatus that is operable to perform turbo encoding and/or decoding processing.

FIG. 4 illustrates an alternative embodiment of an apparatus 400 that is operable to perform turbo encoding and/or decoding processing. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which turbo encoding and/or decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of turbo encoding and/or decoding processing in accordance with those presented herein, and equivalents thereof, may be applied to many types of communication systems and/or communication devices.

Figure 5:
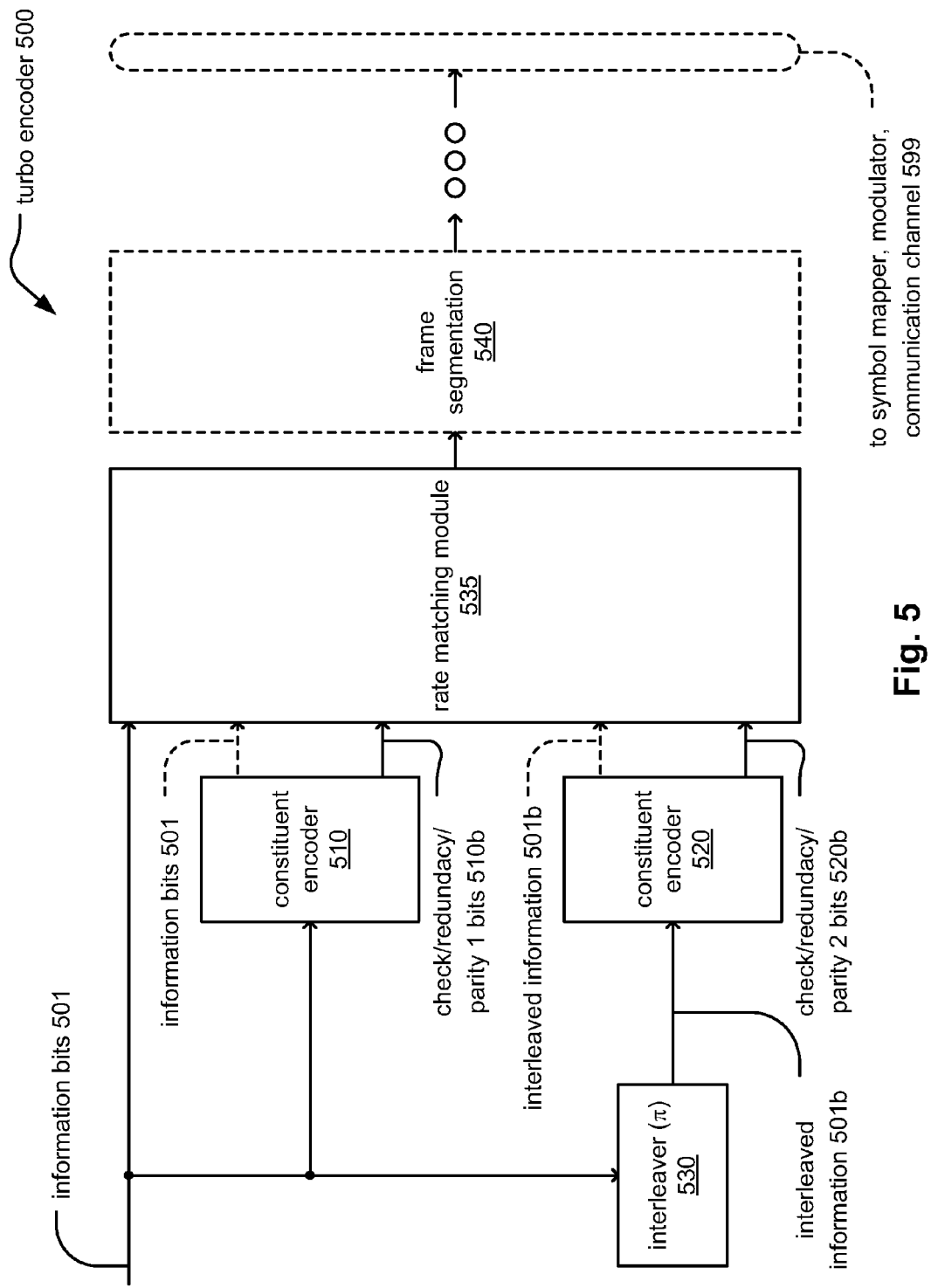
FIG. 5 and FIG. 6 illustrate embodiment of turbo encoding modules.
Figure 6:
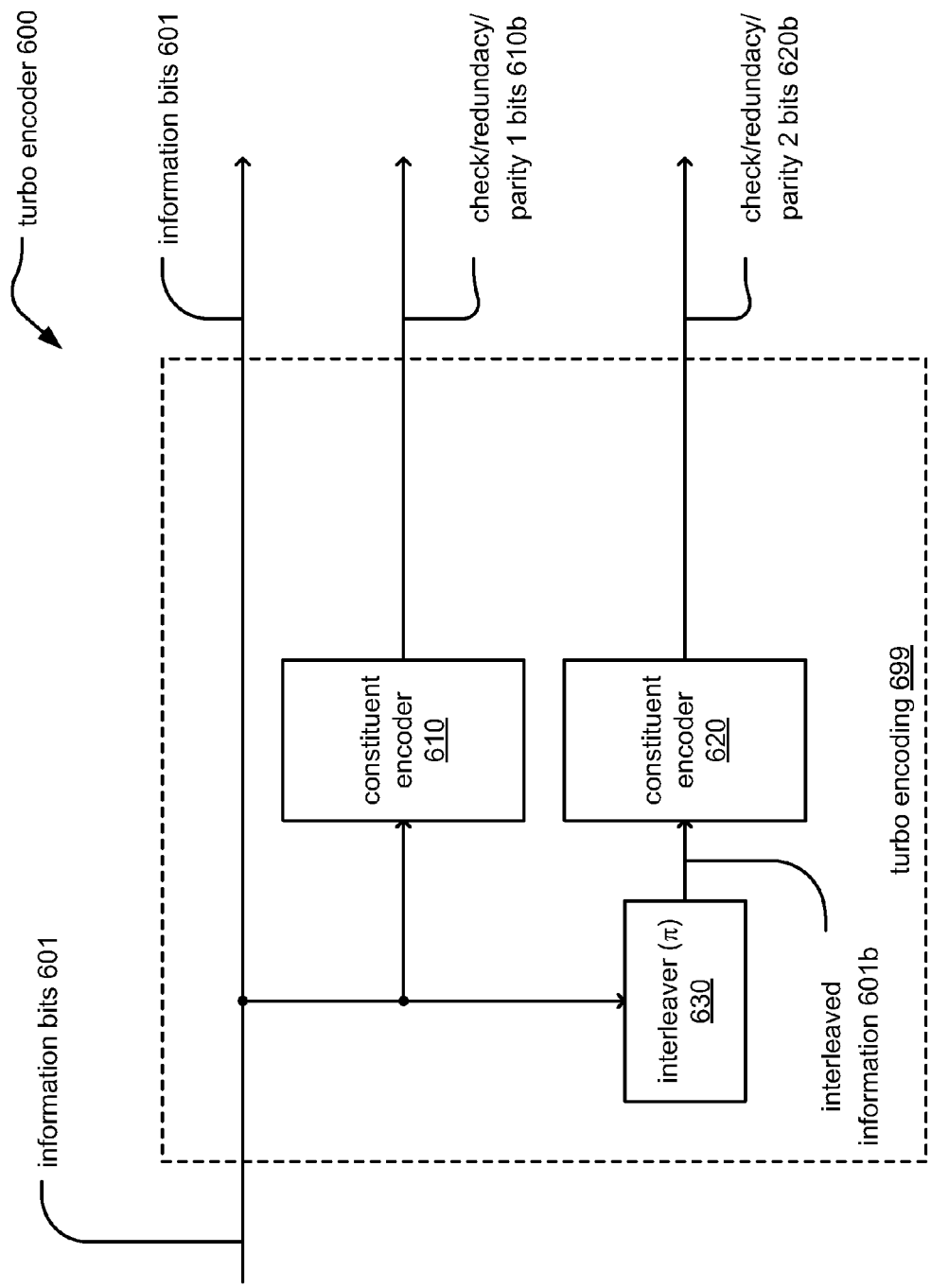

FIG. 5 and FIG. 6 illustrate embodiment of turbo encoding modules 500 and 600, respectively.

FIG. 5 illustrates an embodiment of a turbo encoding module 500. Information bits are provided to an interleaver ($\pi$) module 530 that is operable to generate interleaved information 501b. The interleave ($\pi$) employed by the interleaver ($\pi$) module 530 can be a QPP interleave ($\pi$) in some embodiments. Alternatively, other desired interleaves ($\pi$) can be employed by the interleaver ($\pi$) module 530 without departing from the scope and spirit of the invention.

These information bits 501 are also passed to a first constituent encoder 510 from which both the information bits 501 as well as check/redundancy/parity 1 bits 510b are output there from.

The interleaved information 501b output from the interleaver ($\pi$) module 530 is also passed to a second constituent encoder 520 from which both the interleaved information 501b as well as check/redundancy/parity 2 bits 520b are output there from.

In the art, the parity bits output from a turbo encoder are sometimes referred to as check bits, parity bits, and/or redundancy bits. Moreover, the information bits output from a turbo encoder are sometimes referred to as the information bits (i.e., the very same as was provided to the turbo encoder) and also as systematic bits (e.g., in the context of a systematic encoder that, when encoding information bits, outputs those same information bits as well as check/redundancy/parity bits). Herein, parity bits and is oftentimes employed for reference to these check/redundancy/parity bits output from a turbo encoder, and information bits is oftentimes employed for reference to these information/systematic bits output from a turbo encoder.

Each of the information bits 501, the parity 1 bits 510b, and the parity 2 bits 520b is provided to a rate matching module 535 that is operable to perform appropriate rate matching. Thereafter, the rate matched signal can be provided to a frame segmentation module 540. Various other components can also be situated as part of or after the frame segmentation module 540 to assist in the generation of an encoded block that may then be passed to a symbol mapper where the symbols may be mapped according to the appropriate modulation (constellation and mapping). These symbol mapped symbols may then undergo any appropriate modulation as required to generate a continuous-time signal whose format comports with a communication channel into which the turbo coded signal is to be launched.

FIG. 6 illustrates an embodiment of a turbo encoding module 600. Information bits are provided to an interleaver ($\pi$) module 630 that is operable to generate interleaved information 601b. The interleave ($\pi$) employed by the interleaver ($\pi$) module 630 can be a QPP interleave ($\pi$) in some embodiments. Alternatively, other desired interleaves ($\pi$) can be employed by the interleaver ($\pi$) module 630 without departing from the scope and spirit of the invention.

These information bits 601 are also passed to a first constituent encoder 610 from which both the information bits 601 as well as check/redundancy/parity 1 bits 610b are output there from.

The interleaved information 601b output from the interleaver ($\pi$) module 630 is also passed to a second constituent encoder 620 from which both the interleaved information 601b as well as check/redundancy/parity 2 bits 620b are output there from.

Figure 7:
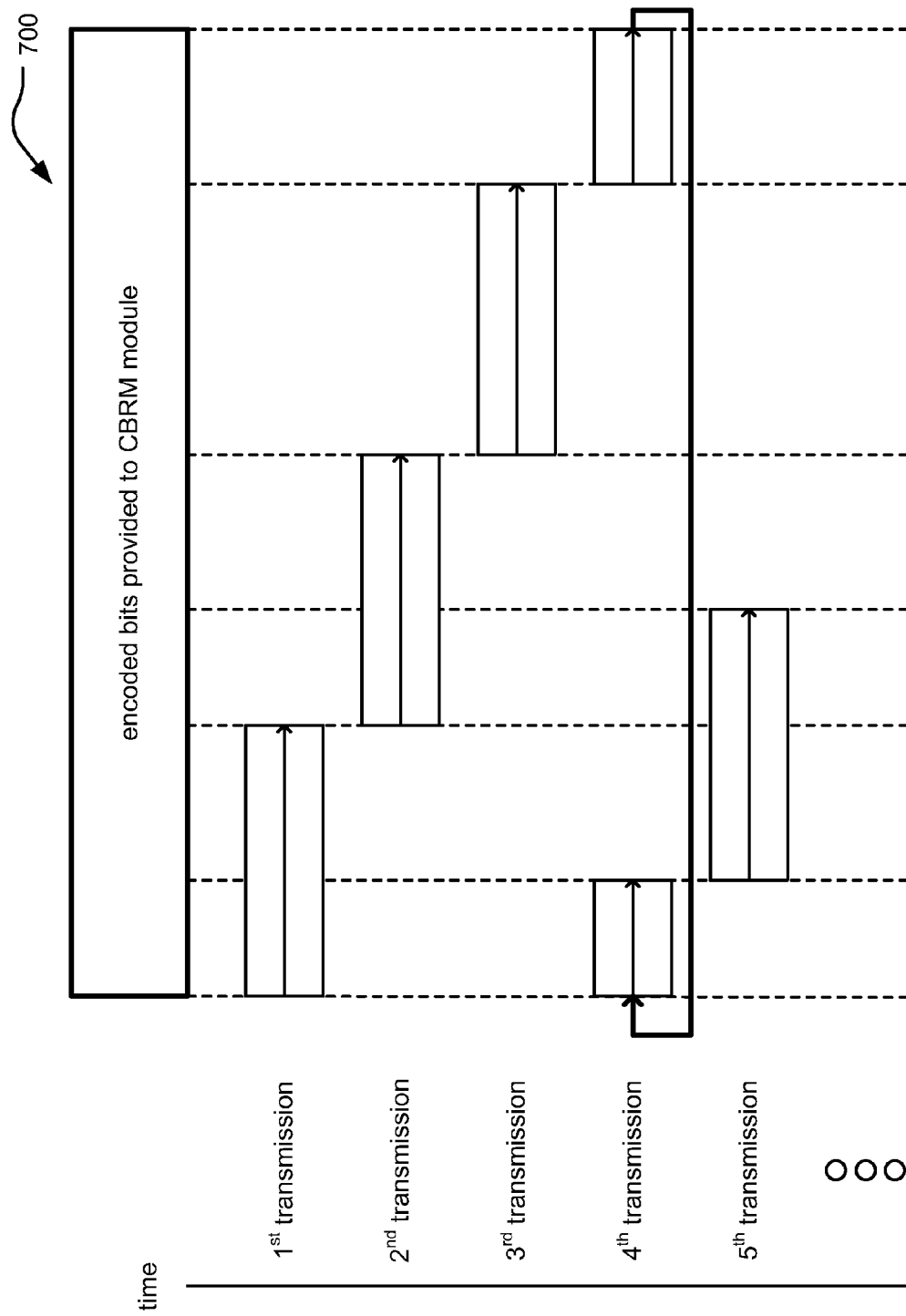
FIG. 7 illustrates an embodiment of circular shifting of encoded bits for various transmissions.

FIG. 7 illustrates an embodiment 700 of circular shifting of encoded bits for various transmissions. In this diagram, encoded bits undergo circular shifting to ensure that different sets bits are output during each subsequent transmission.

The encoded bits can include fill bits (e.g., as may be required in accordance with QPP interleaving) and/or dummy bits (e.g., as may be required in accordance with sub-block interleaving). De-padding can firstly be performed on the encode bits to ensure that any fill bits and/or dummy bits are removed from the encoded bits. Thereafter, the RV starting point calculation can be performed on the remaining bits to ensure that the appropriate starting position is selected for each subsequent transmission after the first transmission. For example, in many of the subsequent performance diagrams included herein, one transmission which is accompanied by 3 subsequent re-transmissions are made.

During a first transmission, a first set of bits is sent out.

During a second transmission, a second set of bits (that follows the first set of bits) is sent out. The starting point (e.g., the indication of which bit is the first bit of this second set of bits) can be effectuated using the equation (2) described herein.

During a third transmission, a third set of bits (that follows the second set of bits) is sent out.

During a fourth transmission, a fourth set of bits (that follows the third set of bits) is sent out. As can be seen, the circular shifting of the encoded bits has reached the end thereof, so the circular shifting now wraps around and employs a first subset of the bits sent out in the first transmission.

During a fifth transmission, a fifth set of bits (that follows the fourth set of bits) is sent out.

As can be seen, each subsequent transmission has little or no overlap whatsoever to its immediately preceding transmission. However, depending on the size and number of the codewords and/or encoded bits that undergo this processing, then there can be some overlap between various of the transmissions (e.g., the first and fourth transmissions have some overlap; the first and fifth transmissions have some overlap; the second and fifth transmissions have some overlap, and so on). However, there is ensured a high degree of orthogonality (e.g., little overlap) between successive transmissions.

Figure 8:
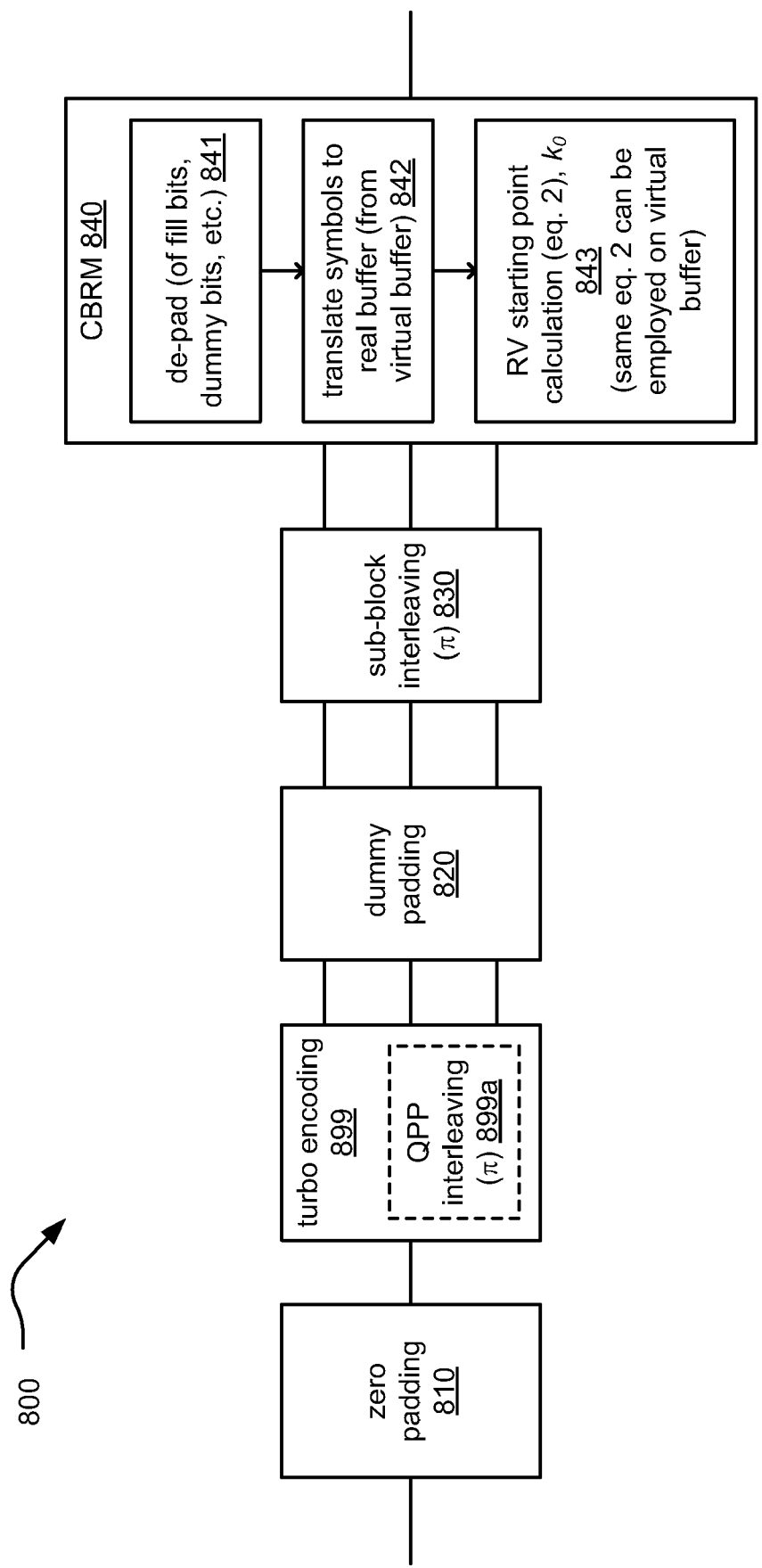
FIG. 8 illustrates an embodiment of a communication device that employs circular buffer rate matching (CBRM).
Figure 9:
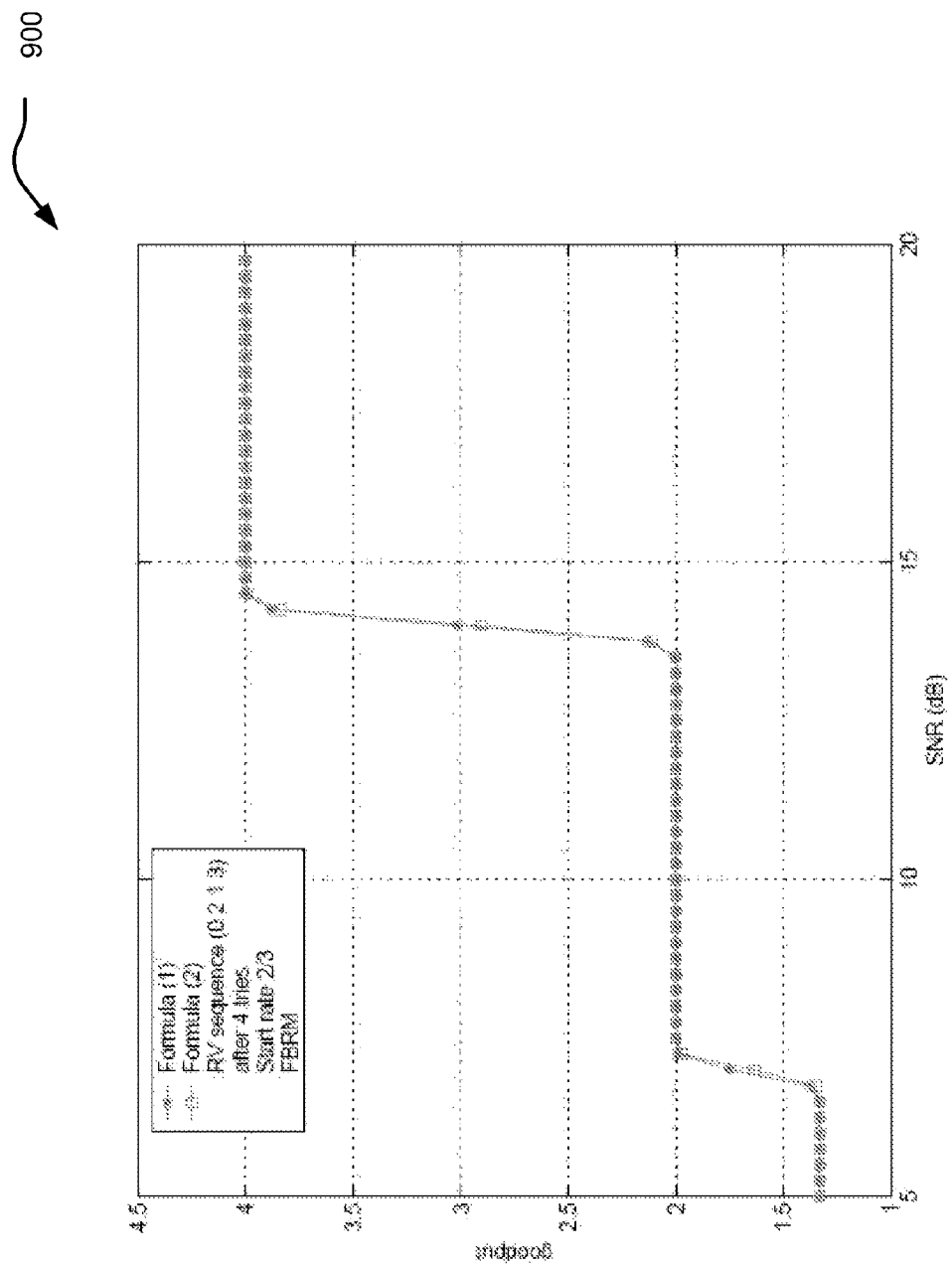
FIG. 9, FIG. 10, FIG. 11, and FIG. 12 illustrate embodiments of performance diagrams for full buffer rate matching (FBRM).
Figure 10:
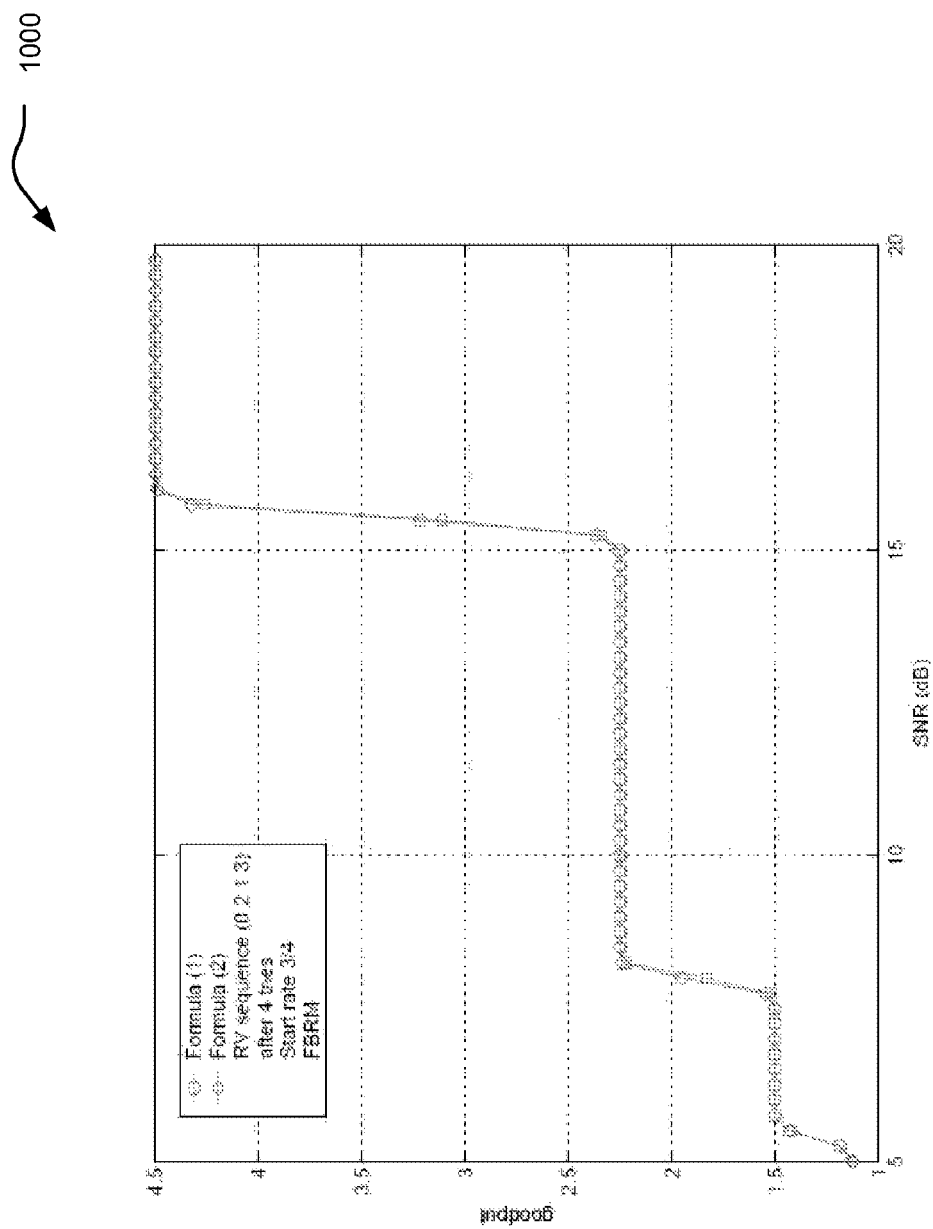
Figure 11:
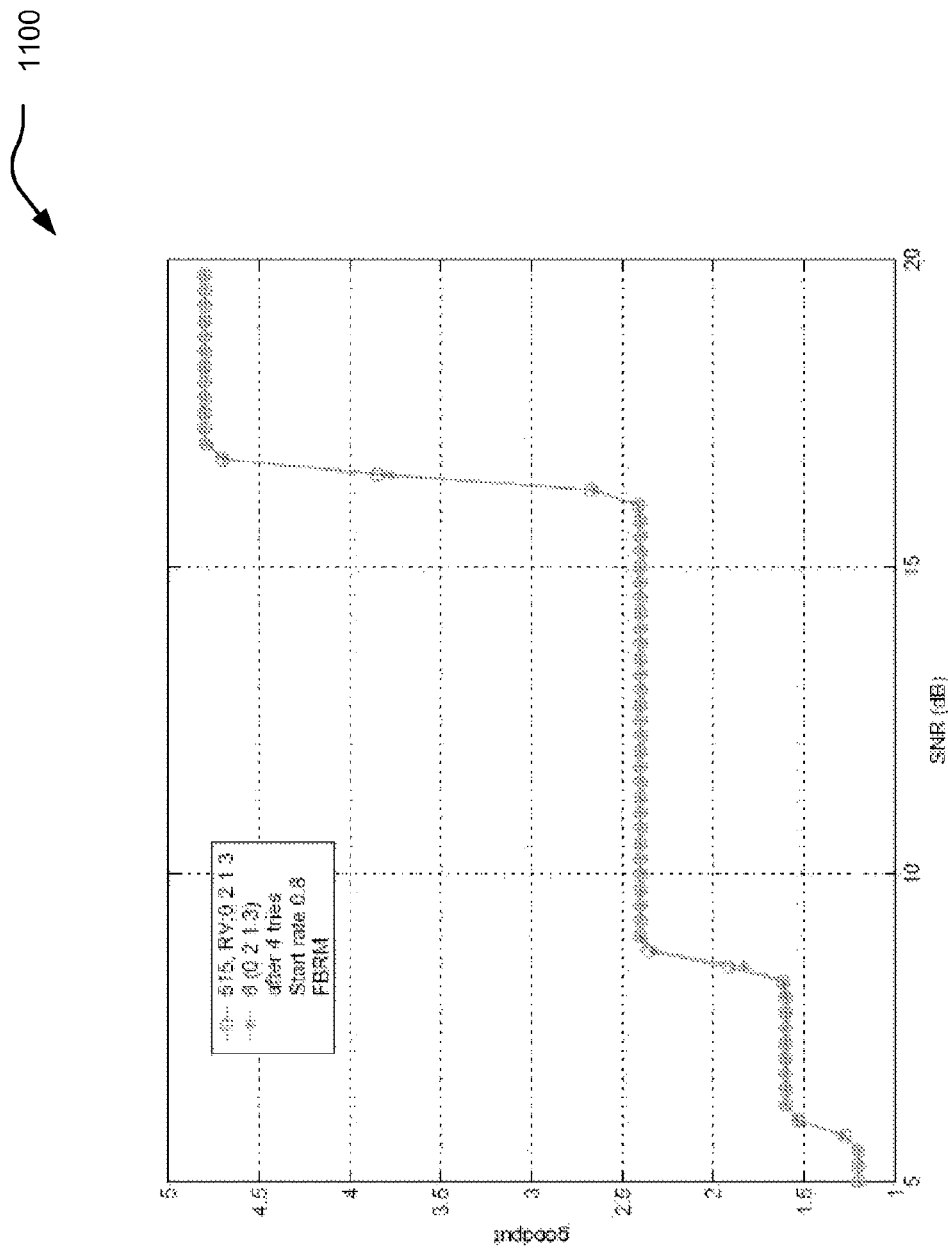
Figure 12:
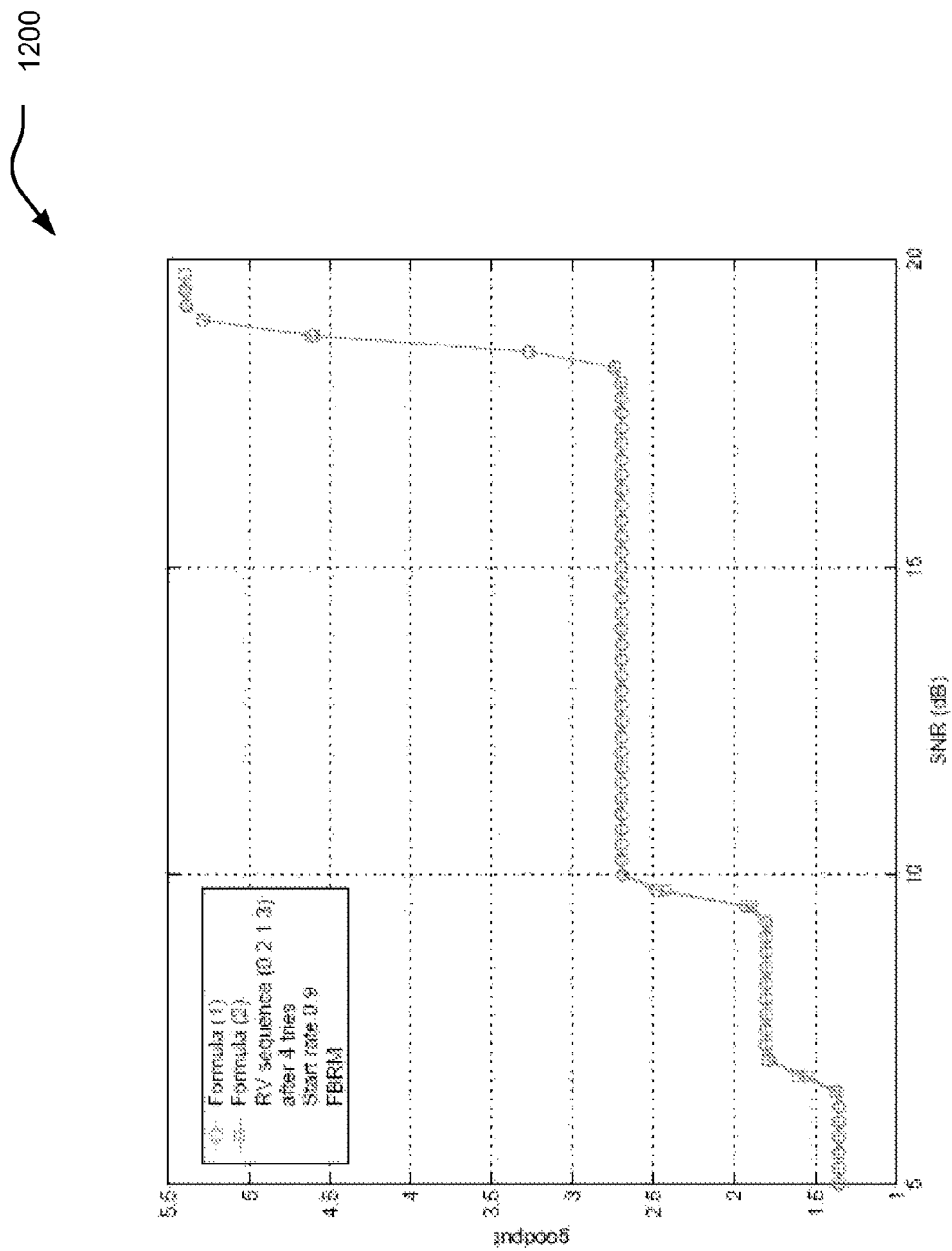
Figure 13:
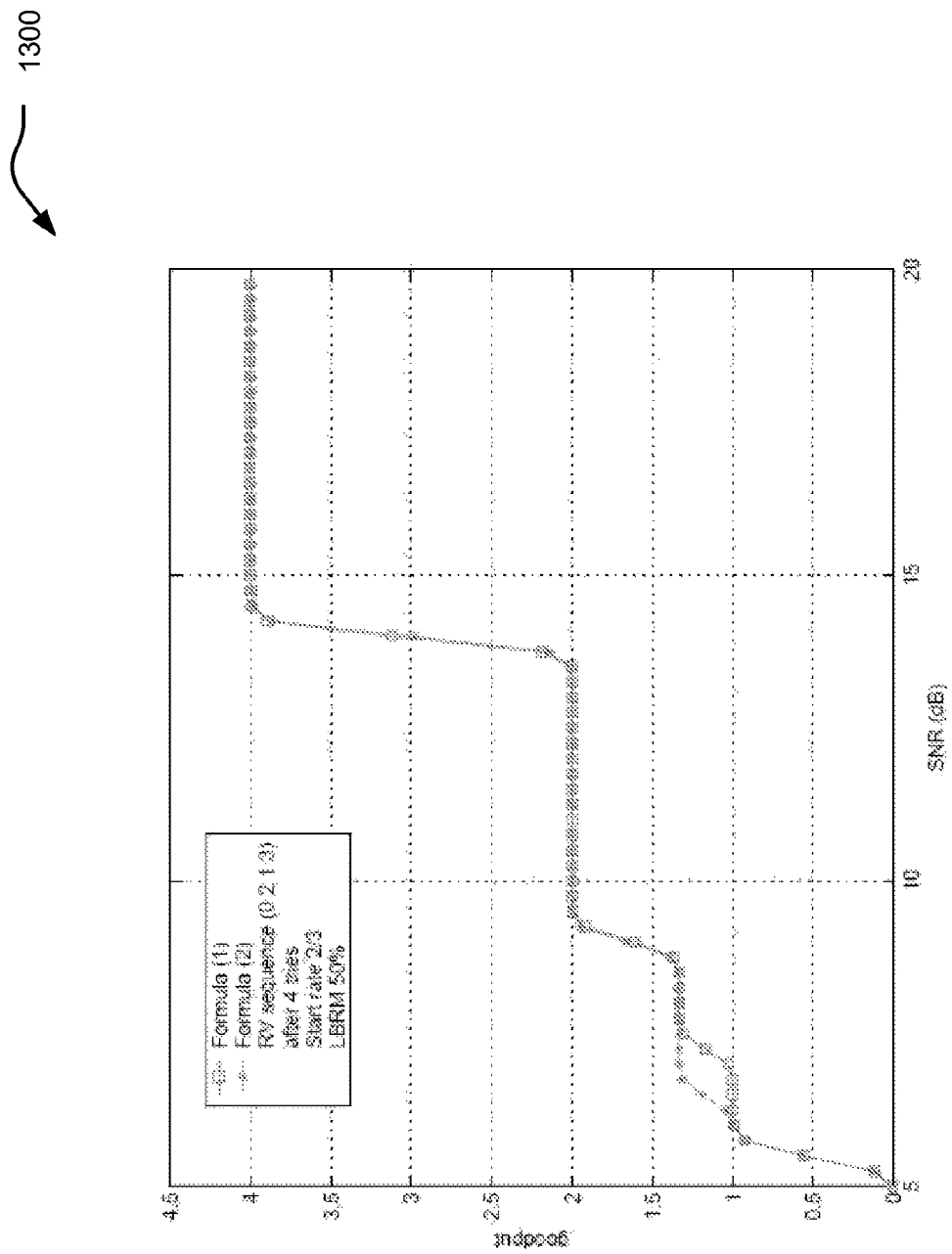
FIG. 13, FIG. 14, FIG. 15, and FIG. 16 illustrate embodiments of performance diagrams for limited buffer rate matching (LBRM).
Figure 14:
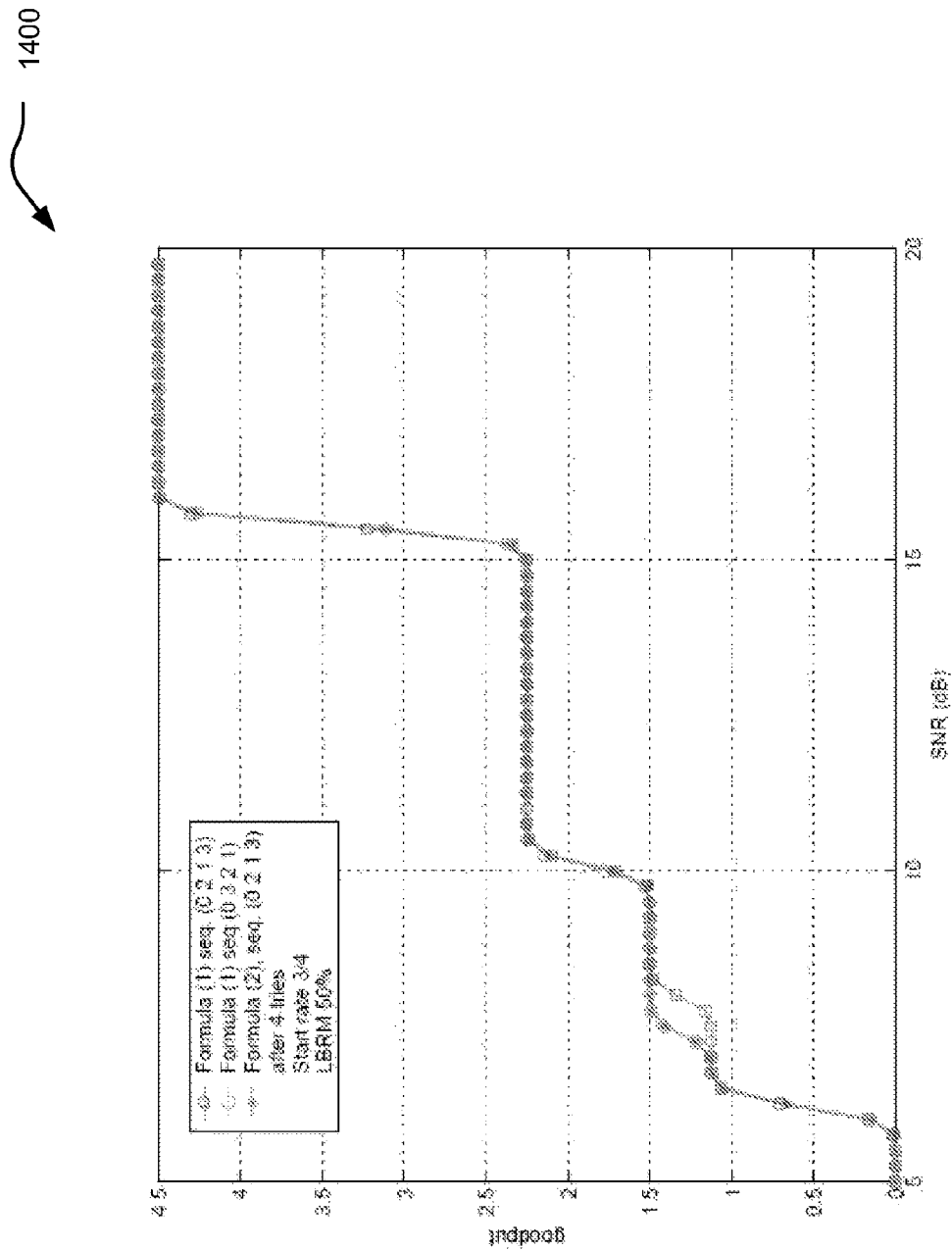
Figure 15:
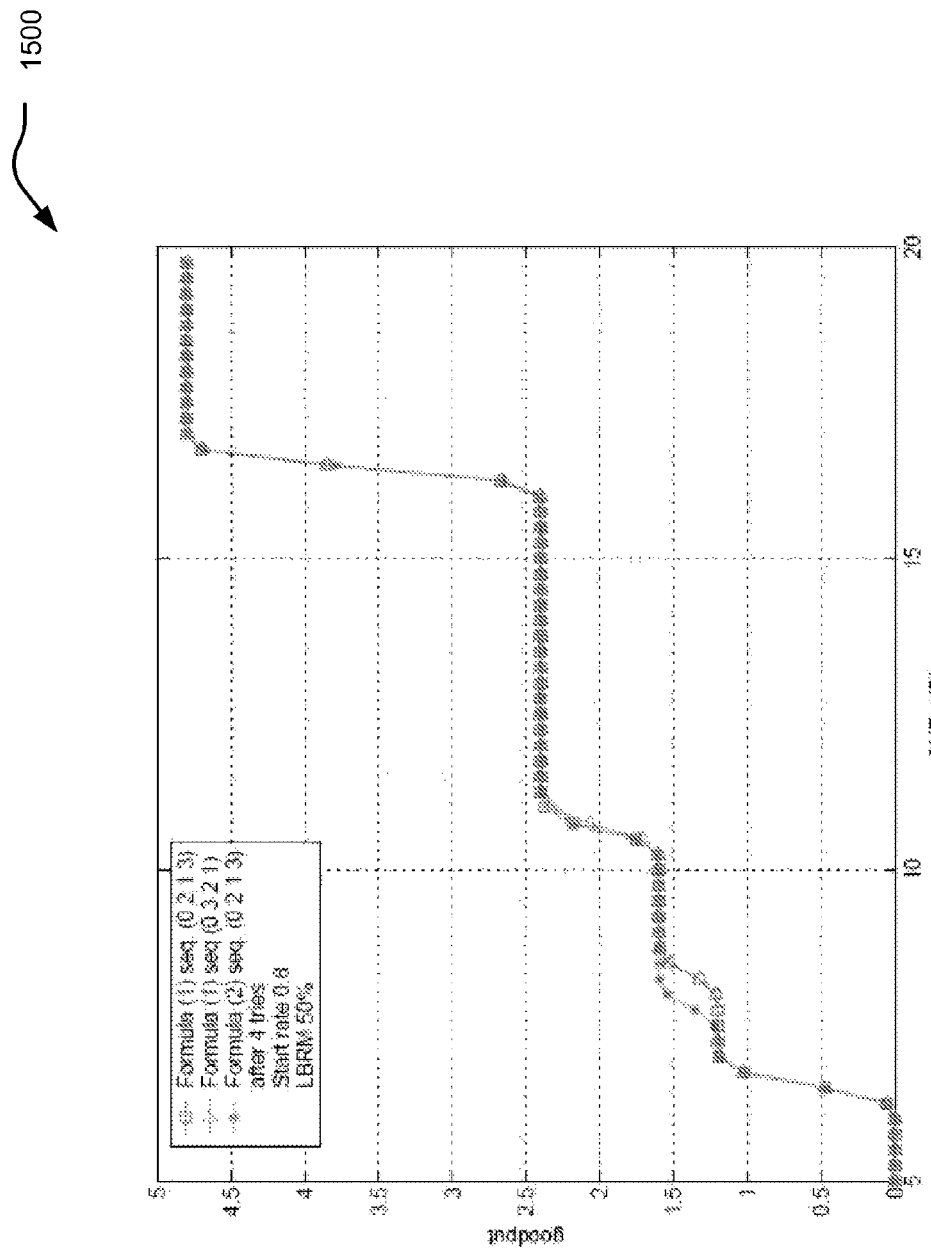
Figure 16:
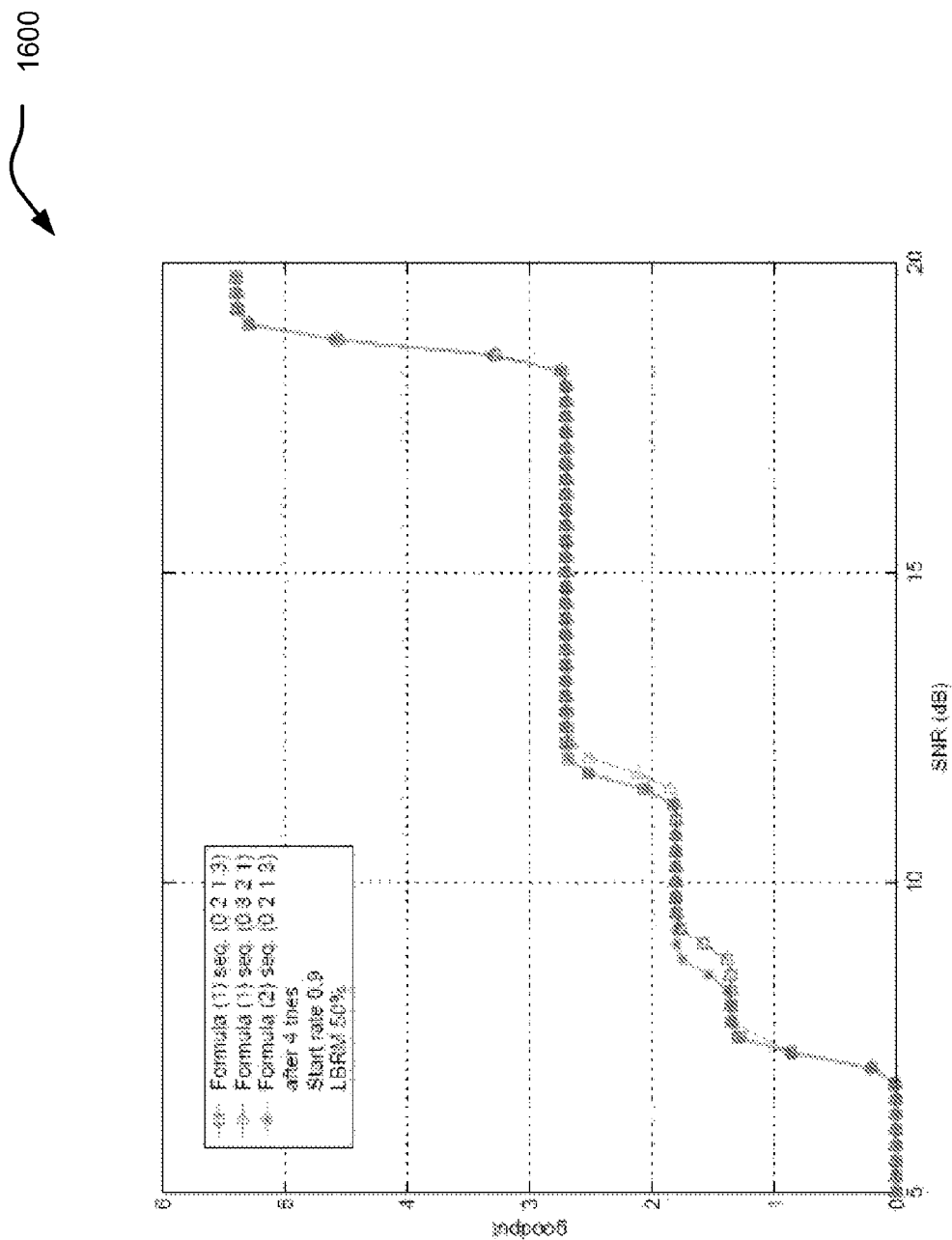

FIG. 8 illustrates an embodiment of a communication device 800 that employs circular buffer rate matching (CBRM). A novel means for performing combined zero bit de-padding for turbo code and dummy bits de-padding for rate matching is presented. In addition, the novel means of determining the starting point employed for the circular buffering is also included within this embodiment.

A zero padding module 810 that is operable to pad at least one zero bit to an information bit stream thereby generating a zero padded information bit stream. These zero padded bits (or fill bits) may be needed to ensure that the block size is appropriate for QPP interleaving 899a in accordance with a subsequent turbo encoding within turbo encoding module 899. Thereafter, the zero padded information bit stream is provided to the turbo encoding module 899 (e.g., which may be analogous to the embodiment in FIG. 6) that is implemented encode the zero padded information bit stream thereby generating a plurality of systematic bits, a first plurality of parity bits, and a second plurality of parity bits. For example, the turbo encoding module 899 is operable to encode in an analogous manner that the turbo encoding module 699 of the FIG. 6 is able to do.

As may be needed in accordance with subsequent sub-block interleaving, a dummy padding module 820 is then operable to pad at least one dummy bit to at least one of the plurality of systematic bits, the first plurality of parity bits, and the second plurality of parity bits thereby generating at least one of a plurality of dummy padded systematic bits, a first plurality of dummy padded parity bits, and a second plurality of dummy padded parity bits. In some embodiments, the dummy padding module 820 is operable to pad dummy bits to each of the plurality of systematic bits, the first plurality of parity bits, and the second plurality of parity bits.

A sub-block interleaving module ($\pi$) 830 is then operable to perform sub-block interleaving on at least one of the plurality of dummy padded systematic bits, the first plurality of dummy padded parity bits, and the second plurality of dummy padded parity bits thereby generating a plurality of sub-block interleaved dummy padded systematic bits, a first plurality of sub-block interleaved, dummy padded parity bits, and a second plurality of sub-block interleaved, dummy padded parity bits.

A circular buffer rate matching (CBRM) module 840 is then operable to de-pad any zero padded bits and/or fill bits and any dummy padded bits from each of the plurality of sub-block interleaved, dummy padded systematic bits, the first plurality of sub-block interleaved, dummy padded parity bits, and the second plurality of sub-block interleaved, dummy padded parity bits thereby generating an output information bit stream. For example, the CBRM module 840 is then operable to perform both zero bit and/or fill bit de-padding and dummy bit de-padding, as shown in block 841. In some embodiments, the decision-making of which bits (either only one or both of zero padded bits and dummy padded bits) within each of the plurality of sub-block interleaved, dummy padded systematic bits, the first plurality of sub-block interleaved, dummy padded parity bits, and the second plurality of sub-block interleaved, dummy padded parity bits is to be de-padded can be implemented in a variety of ways including using code (e.g., such as software, firmware, combination thereof, and/or some other means).

Generally speaking, depending on which of the 3 streams (e.g., [a] the plurality of sub-block interleaved, dummy padded systematic bits, [b] the first plurality of sub-block interleaved, dummy padded parity bits, and [c] the second plurality of sub-block interleaved, dummy padded parity bits) is being processed, then in accordance with the appropriate decision-making, only the proper bits get de-padded in the CBRM module 840.

For example, let $N_{LBRM}$ be the soft buffer size for Categories 3-5, respectively. Then $N_{TB,LBRM} = N_{LBRM}/16$ is the soft buffer size for one transport block.

The virtual circular buffer of length $K_w = 3K_\Pi$ for the r-th coded block is generated as follows:

$w_k = v_k^{(0)}$ for $k=0, \ldots, K_\Pi -1$, e.g., corresponding to [a] just above $w_{K_\Pi + 2k} = v_k^{(1)}$ for $k=0, \ldots, K_\Pi -1$, e.g., corresponding to [b] just above $w_{K_\Pi + 2k+1} = v_k^{(2)}$ for $k=0, \ldots, K_\Pi -1$, e.g., corresponding to [c] just above This translation then ensures that the bits of w are aligned properly within the real circular buffer. Then, after performing the translation from the virtual circular buffer to the real circular buffer, the real full circular buffer for the r-th code block will store the soft information of the following sequence:

```
Set k = 0, j = 0, K_v^r = 0.
while { k < K_w }
    if w_k ≠ < NULL >
        u_j = w_k
        j = j + 1
        K_v^r = K_v^r + 1
    end if
    k = k+1
end while
```

This functionality as described above performs the appropriate de-padding (as shown in block 841), so that subsequent translation can be performed to translate the bits from the virtual circular buffer to the real circular buffer (i.e., the real full circular buffer for the r-th code block) may be viewed as being performed within the block 841.

Denote the real soft buffer size for the r-th code block by $N_{cb}^r$ bits. Size $N_{cb}^r$ is obtained as follows, where C is the number of code blocks computed in sub-clause 5.1.2.

$$N_{cb}^r = \min\left(\left\lfloor \frac{N_{TB,LBRM}}{C} \right\rfloor, K_v^r\right)$$

Denoting by E the rate matching output sequence length for the r-th coded block, and $rv_{idx}$ the redundancy version number for this transmission, the rate matching output bit sequence is $e_k$, $k=0, 1, \ldots, E-1$.

Define by G the total number of bits available for the transmission of one transport block.

Set $G'=G/(N_L \cdot Q_m)$ where $Q_m$ is equal to 2 for QPSK, 4 for 16 QAM and 6 for 64 QAM, and where $N_L$ is equal to 1 for blocks mapped onto one transmission layer and is equal to 2 for blocks mapped onto two or four transmission layers.

Set $\gamma = G'$ mod C, where C is the number of code blocks computed in sub-clause 5.1.2.

```
if r ≤ C - γ - 1
    set E = N_L · Q_m · ⌊G'/C⌋
else
    set E = N_L · Q_m · ⌈G'/C⌉
end if
```

$$\text{Set } k_0 = R \cdot \left(2 \cdot \left\lceil \frac{N_{cb}^r}{8R} \right\rceil \cdot rv_{idx} + 2\right)$$

$$\left(\text{or } k_0 = \left\lceil \frac{N_{cb}^r}{4} \right\rceil \cdot rv_{idx} + 2R, \text{ as within equation (2)}\right), \text{ where R is the}$$

number of rows defined in sub-clause 5.1.4.1.1.

```
Set k = 0 and j = 0
while { k < E }
    e_k = v_{(k_0 + j) mod N_cb^r}
    k = k + 1
    j = j + 1
end while
```

The now de-padded bits have then been translated from symbols within the virtual circular buffer (VCB) into the real circular buffer, as shown in block 842. The RV starting point calculation is then performed using the remaining bits after the de-padding has been appropriately performed, as shown in block 843. The RV starting point calculation is then performed only on the remaining, actual information bits (e.g., not based on any fill and/or pad bits which have been de-padded). The CBRM module 840 is operable to employ a novel means by which the RV starting point can be calculated as described herein (e.g., in equation (2)), as shown in block 843.

The output information bit stream (e.g., output from the CBRM module 840) can then undergo modulation to generate a turbo coded signal that comports with a communication channel. This can be performed in one or more of a symbol mapper, a modulator, and/or other processing module. The turbo coded signal may then be launched into a communication channel implemented within any of a variety of communication systems (e.g., including but not limited to those described with respect to FIG. 1).

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at such performance curves, the BLER [or BER] may be determined for any given $E_b/N_o$ (or SNR) thereby providing a relatively concise representation of the performance of the decoding approach.

Other times, performance diagrams are described in the context of $E_b/N_o$ (ratio of energy per bit $E_b$ to the Spectral Noise Density $N_o$) versus interleaver size (e.g., interleaver (π) block size/information block size of the turbo coded signal).

Similar to as described in reference [4], the presentation herein focuses on the performance of a transport block (TB) composed of one code block. In other words, the TB size selected in this study was 6120 bits, which becomes 6144 bits after appending 24 cyclic redundancy check (CRC) bits. All hybrid automatic repeat request (HARQ) transmissions of a given TB have the same code rate (i.e., equi-sized transmission is assumed). In the full buffer rate matching (FBRM) simulations, no constraint was placed on the rate matching circular buffer. In the limited buffer rate matching (LBRM), in cases of 50% of FBRM and 75% of FBRM are considered. 64 QAM (quadrature amplitude modulation) are used and simulations are conducted on an additive white Gaussian noise (AWGN) channel.

The goodput of these scenarios are plotted in the subsequent diagrams, where goodput is defined as the average number of information bits per channel as used in reference [4]. The RV starting point sequences employed include those selected in reference [4].

FIG. 9, FIG. 10, FIG. 11, and FIG. 12 illustrate embodiments of performance diagrams 900, 1000, 1100, and 1200, respectively, for full buffer rate matching (FBRM).

FIG. 13, FIG. 14, FIG. 15, and FIG. 16 illustrate embodiments of performance diagrams 1300, 1400, 1500, and 1600, respectively, for limited buffer rate matching (LBRM).

For the turbo coding that is employed for 3GPP LTE channel coding, the limited buffer rate matching (LBRM) (as in reference [2]) was adopted in RAN1 #51bis. The functionality of the LBRM employs the use of a virtual buffer or virtual limited buffer. The virtual buffer is the buffer (e.g., memory storage device and/or medium) constructed by sub-block interleave columns which contains both zero and/or filling bits and dummy bits on a base station side (e.g., eNB) and soft information of the filling bits and dummy bits for a mobile station (e.g., UE).

It is also noted that the size of the virtual limited buffer (e.g., which can be viewed as being a soft buffer) for a given transport block has been set and agreed upon for the turbo coding that is employed for 3GPP LTE channel coding (e.g., see reference [5]).

This size of the virtual limited buffer is the maximal size of an actual buffer that contains only the coded bits for a hybrid automatic repeat request (HARQ) transmission. In reference [2], this size is denoted by the transport block size of $N_{IR}$. If a transport block (e.g., having size $N_{IR}$) is segmented to a number of code blocks (e.g., C code blocks), then, as described in reference [2], the buffer size of a code block (CB) is defined by $$N_{cb} = \min\left(\left\lfloor \frac{N_{IR}}{C} \right\rfloor, K_w\right)$$

where $K_w$ is the size of the full virtual buffer.

According to this definition, a) $N_{CB}$ is the size of full virtual buffer when $\lfloor N_{IR}/C \rfloor \geq K_w$, or b) $N_{CB}$ is the size of the exact buffer when $\lfloor N_{IR}/C \rfloor < K_w$.

However, it is noted that the pseudo code described near the end of reference [2] treats $N_{CB}$ as the size of the virtual limited buffer. In doing so, the approach of reference [2] causes inconsistency with b) above. Therefore, a novel modification approach is presented herein for dealing with such inconsistency.

There are at least three novel approaches by which this modification can be performed as presented herein. These three novel approaches are as follows:

(1) Modify the transport block size ($N_{IR}$) to be the same size as the virtual limited buffer size, i.e. the size of the buffer then includes those zero/filling bits and those dummy bits that are never transmitted. Obviously, this includes implementing sufficient memory for the zero/filling bits and the dummy bits at communication devices implemented at both ends of a communication channel (e.g., in both the eNB and UE in the 3GPP LTE channel coding context).

(2) Modify the size of each code block ($N_{CB}$) to be the same size as the virtual limited buffer size, i.e. the size of the buffer then includes those zero/filling bits and those dummy bits that are never transmitted for only one of the code blocks having size ($N_{CB}$) (e.g., NOT all of the those zero/filling bits and those dummy bits that are never transmitted for the entire transport block size ($N_{IR}$)). This inherently requires a proper calculation of the size of each code block ($N_{CB}$). Moreover, in every HARQ transmission, one or both of the communication devices implemented at one end of a communication channel (e.g., the eNB and UE in the 3GPP LTE channel coding context) need to do "de-padding" to strip the zero/filling bits and the dummy bits. In some embodiments, only one of the communication devices implemented at both ends of a communication channel (e.g., the eNB) has to do "de-padding" to strip the zero/filling bits and the dummy bits.

(3) Modify the LBRM procedure in terms of the novel redundancy version starting point calculation presented herein (e.g., as described in equation (2) above and in other sections herein). As also described herein (e.g., as in FIG. 8 and related written description portions), this novel, modified procedure does the de-padding before storing information into the buffer. In this way the buffer will not contain zero/filling bits and the dummy bits (or soft information of zero/filling bits and dummy bits). In this way, one of the communication devices implemented at an end of a communication channel (e.g., the eNB) does not need to do de-padding after the first transmission. Moreover, the calculation of the redundancy version starting point/position may can be simplified using a division-less formula (e.g., as described in equation (2) above and in other sections herein). This approach is also described above.

Figure 17:
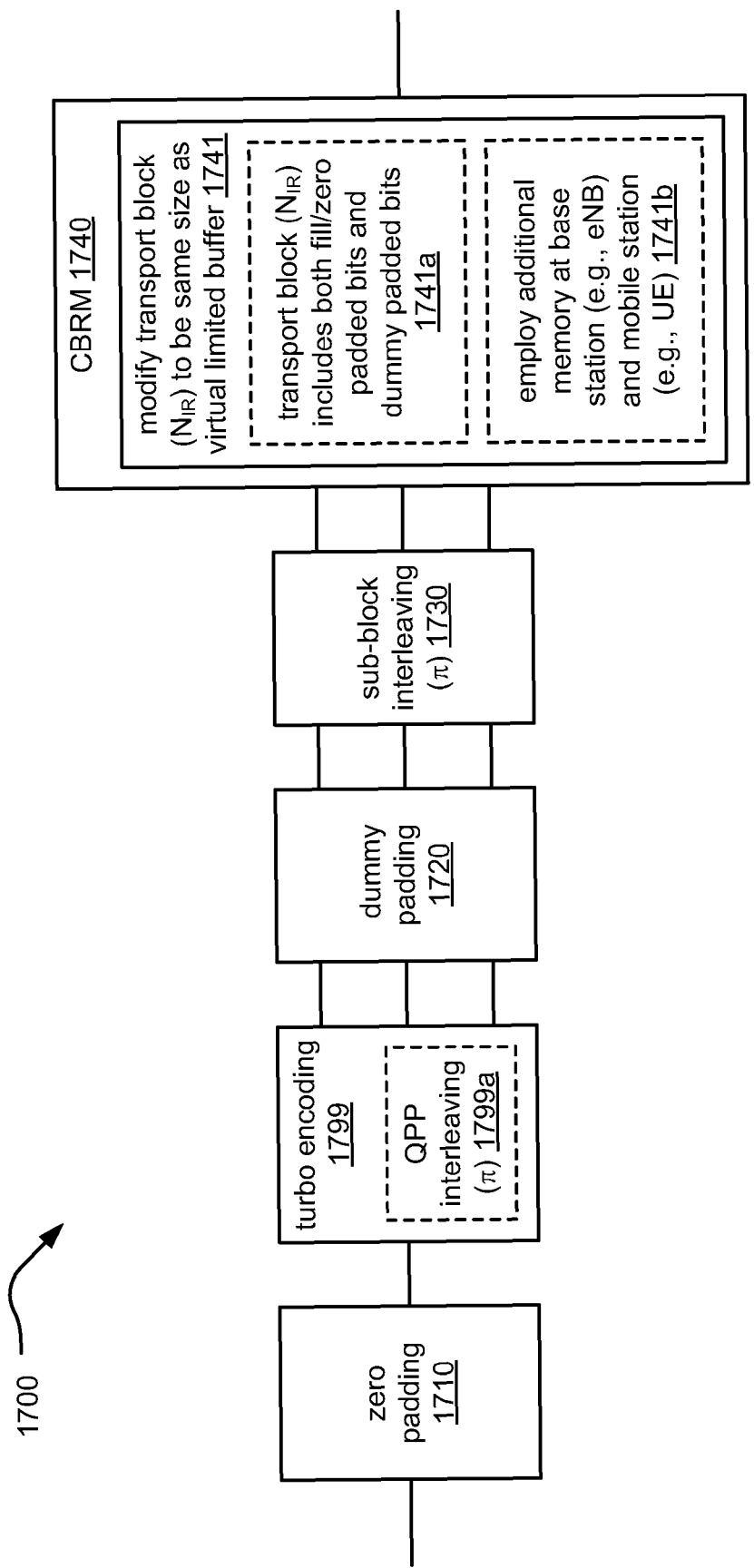
FIG. 17 illustrates an alternative embodiment of a communication device that employs CBRM.

FIG. 17 illustrates an alternative embodiment of a communication device 1700 that employs CBRM. This embodiment has some similarities to that of FIG. 8 with at least certain differences corresponding to operations performed in accordance with rate matching (e.g., within CBRM module 1740).

A zero padding module 1710 that is operable to pad at least one zero bit to an information bit stream thereby generating a zero padded information bit stream. These zero padded bits (or fill bits) may be needed to ensure that the block size is appropriate for QPP interleaving 1799a in accordance with a subsequent turbo encoding within turbo encoding module 1799. Thereafter, the zero padded information bit stream is provided to the turbo encoding module 1799 (e.g., which may be analogous to the embodiment in FIG. 6) that is implemented encode the zero padded information bit stream thereby generating a plurality of systematic bits, a first plurality of parity bits, and a second plurality of parity bits. For example, the turbo encoding module 1799 may be implemented in an analogous manner that the turbo encoding module 699 of the FIG. 6 is implemented.

As may be needed in accordance with subsequent sub-block interleaving, a dummy padding module 1720 is then operable to pad at least one dummy bit to at least one of the plurality of systematic bits, the first plurality of parity bits, and the second plurality of parity bits thereby generating at least one of a plurality of dummy padded systematic bits, a first plurality of dummy padded parity bits, and a second plurality of dummy padded parity bits. In some embodiments, the dummy padding module 1720 is operable to pad dummy bits to each of the plurality of systematic bits, the first plurality of parity bits, and the second plurality of parity bits. With the dummy bit padding as performed within the dummy padding module 1720, the block then has an appropriate size for subsequent sub-block interleaving.

A sub-block interleaving module (π) 1730 is then operable to perform sub-block interleaving on at least one of the plurality of dummy padded systematic bits, the first plurality of dummy padded parity bits, and the second plurality of dummy padded parity bits thereby generating a plurality of sub-block interleaved dummy padded systematic bits, a first plurality of sub-block interleaved, dummy padded parity bits, and a second plurality of sub-block interleaved, dummy padded parity bits.

A CBRM module 1740 is then implemented to perform appropriate rate matching. The CBRM module 1740 operates by modifying the transport block size ($N_{IR}$) to be the same size as the virtual limited buffer size as shown by reference numeral 1741. Therefore, the size of the buffer then includes those zero/filling bits and those dummy bits that are never transmitted, as shown by reference numeral 1741a. Obviously, this includes implementing sufficient memory for the zero/filling bits and the dummy bits at communication devices implemented at both ends of a communication channel (e.g., in both the eNB and UE in the 3GPP LTE channel coding context), as shown by reference numeral 1741b.

Figure 18:
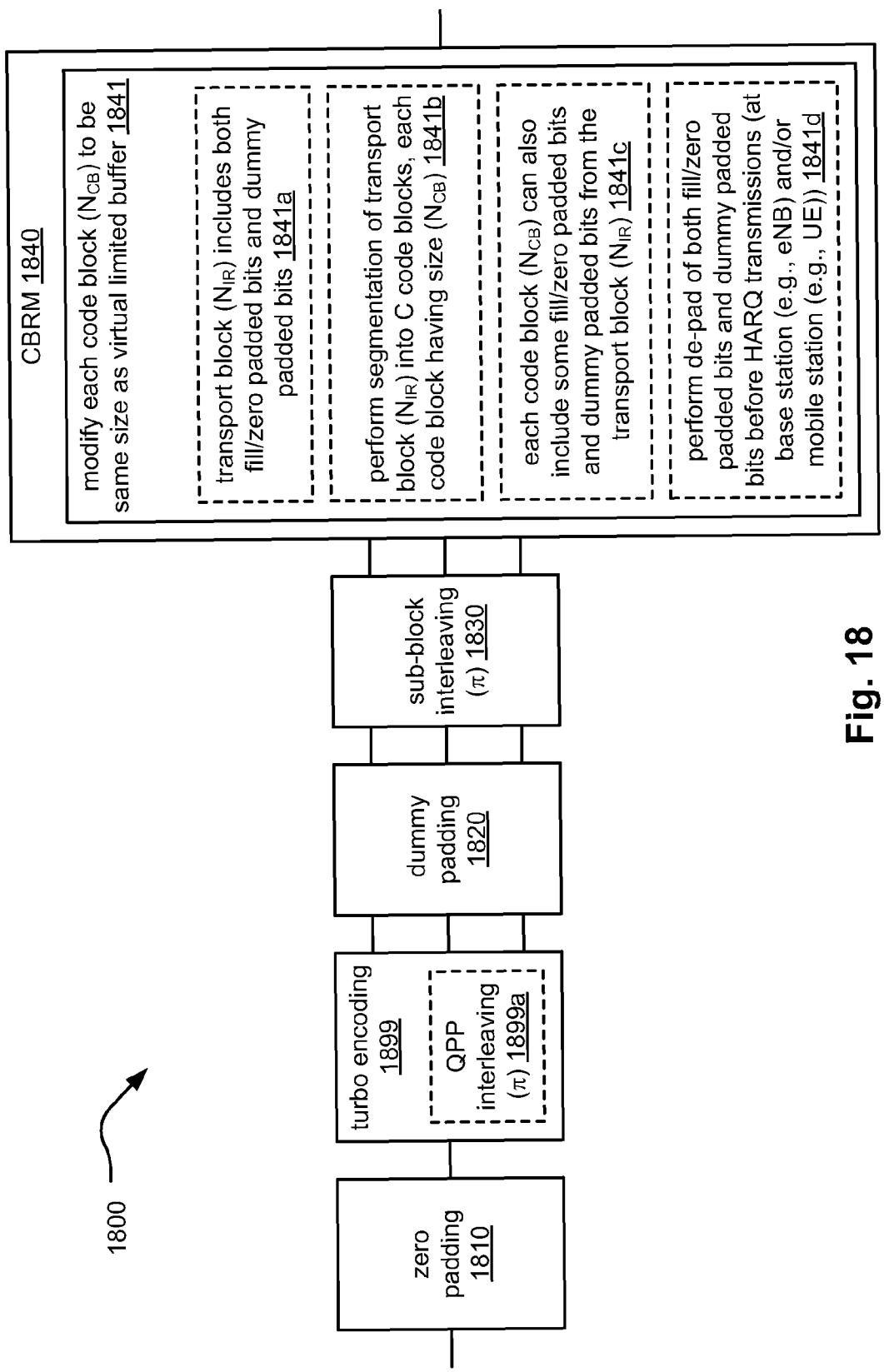
FIG. 18 illustrates an alternative embodiment of a communication device that employs CBRM.

FIG. 18 illustrates an alternative embodiment of a communication device 1800 that employs CBRM. This embodiment also has some similarities to that of FIG. 8 with at least certain differences corresponding to operations performed in accordance with rate matching (e.g., within CBRM module 1840).

A zero padding module 1810 that is operable to pad at least one zero bit to an information bit stream thereby generating a zero padded information bit stream. These zero padded bits (or fill bits) may be needed to ensure that the block size is appropriate for QPP interleaving 1899a in accordance with a subsequent turbo encoding within turbo encoding module 1899. Thereafter, the zero padded information bit stream is provided to the turbo encoding module 1899 (e.g., which may be analogous to the embodiment in FIG. 6) that is implemented encode the zero padded information bit stream thereby generating a plurality of systematic bits, a first plurality of parity bits, and a second plurality of parity bits. For example, the turbo encoding module 1899 may be implemented in an analogous manner that the turbo encoding module 699 of the FIG. 6 is implemented.

As may be needed in accordance with subsequent sub-block interleaving, a dummy padding module 1820 is then operable to pad at least one dummy bit to at least one of the plurality of systematic bits, the first plurality of parity bits, and the second plurality of parity bits thereby generating at least one of a plurality of dummy padded systematic bits, a first plurality of dummy padded parity bits, and a second plurality of dummy padded parity bits. In some embodiments, the dummy padding module 1820 is operable to pad dummy bits to each of the plurality of systematic bits, the first plurality of parity bits, and the second plurality of parity bits. With the dummy bit padding as performed within the dummy padding module 1820, the block then has an appropriate size for subsequent sub-block interleaving.

A sub-block interleaving module (π) 1830 is then operable to perform sub-block interleaving on at least one of the plurality of dummy padded systematic bits, the first plurality of dummy padded parity bits, and the second plurality of dummy padded parity bits thereby generating a plurality of sub-block interleaved dummy padded systematic bits, a first plurality of sub-block interleaved, dummy padded parity bits, and a second plurality of sub-block interleaved, dummy padded parity bits.

A CBRM module 1840 is then implemented to perform appropriate rate matching. The CBRM module 1740 operates by modifying the size of each code block ($N_{CB}$) to be the same size as the virtual limited buffer size as shown by reference numeral 1841. It is of course noted that, the transport block size ($N_{IR}$) is much larger that the size of each code block ($N_{CB}$). As such, the virtual limited buffer size of this embodiment can generally be much smaller than that of the previous embodiment. The transport block size ($N_{IR}$) is segmented into a number of code blocks (e.g., C code blocks, where C is an integer), and the size of each code block is $N_{CB}$, as shown by reference numeral 1841b.

The size of the buffer then includes those zero/filling bits and those dummy bits that are never transmitted for only one of the code blocks having size ($N_{CB}$) (e.g., NOT all of the those zero/filling bits and those dummy bits that are never transmitted for the entire transport block size ($N_{IR}$)). As shown by reference numeral 1841c, each code block having size ($N_{CB}$) can then include some of the fill/zero padded bits and the dummy padded bits from the entire transport block having size ($N_{IR}$). However, this includes only those fill/zero padded bits and the dummy padded bits from the entire transport block that correspond to that particular code block having the size ($N_{CB}$).

This inherently requires a proper calculation of the size of each code block ($N_{CB}$). Moreover, as shown by reference numeral 1841d, in every HARQ transmission, one or both of the communication devices implemented at one end of a communication channel (e.g., the eNB and UE in the 3GPP LTE channel coding context) need to do "de-padding" to strip the zero/filling bits and the dummy bits. In some embodiments, only one of the communication devices implemented at both ends of a communication channel (e.g., the eNB) has to do "de-padding" to strip the zero/filling bits and the dummy bits.

Figure 19:
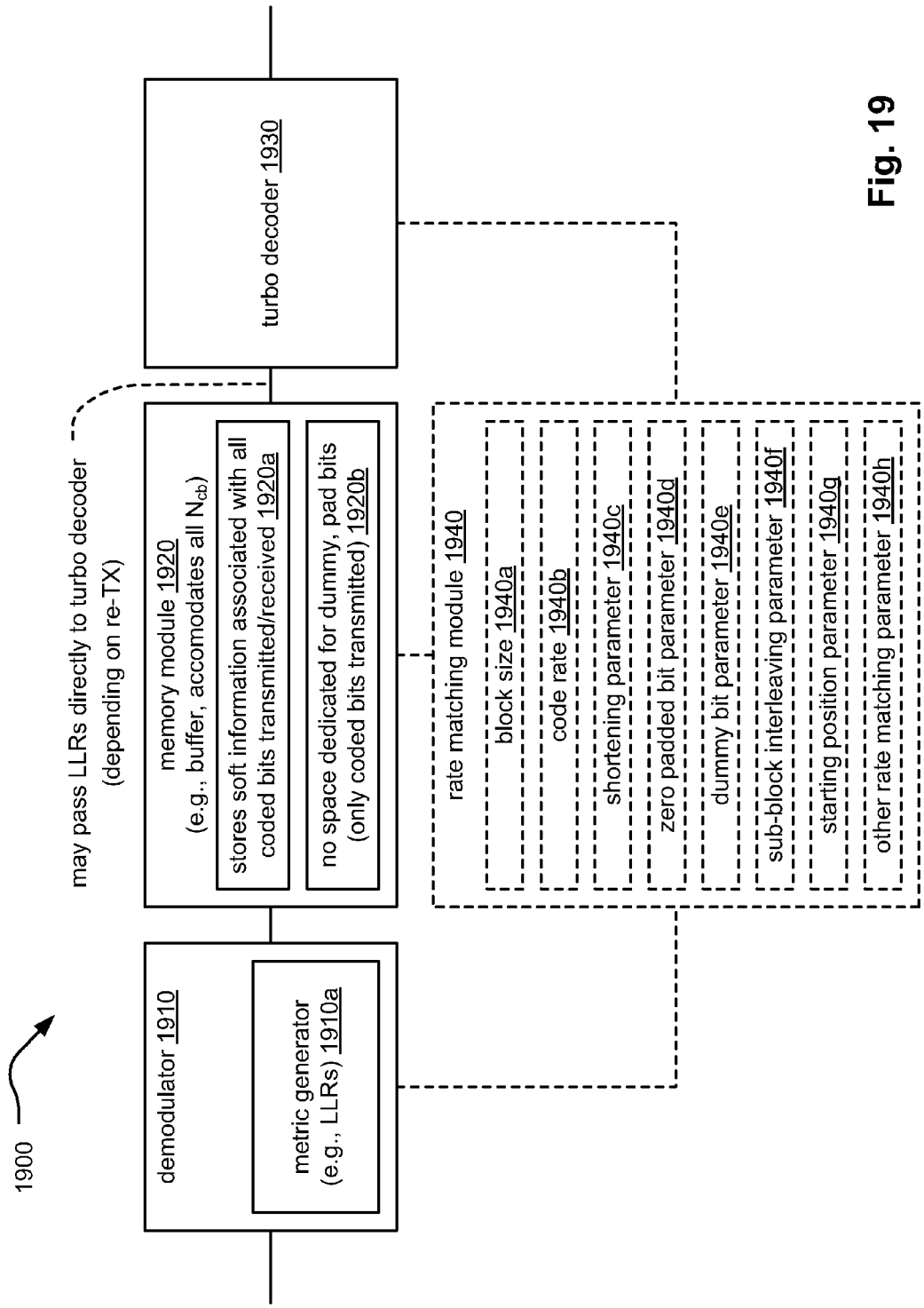
FIG. 19 illustrates an alternative embodiment of a communication device.

FIG. 19 illustrates an alternative embodiment of a communication device 1900. The communication device 1900 includes a demodulator 1910 that processes a signal received from a communication channel. The demodulator 1910 may perform any of a wide variety of functions including digital sampling (e.g., such as using an analog to digital converter (ADC) to generate a digital signal), frequency conversion (in analog or digital domain), filtering (in analog or digital domain), gain adjustment (in analog or digital domain), etc. In addition, the demodulator 1910 includes a metric generator 1910a (alternatively, referred to as an LLR generator) that generates log-likelihood ratios (LLRs) based on bits and/or symbols extracted from the signal received from the communication channel. A memory module 1920, coupled to receive the LLRs from the demodulator 1910. With reference to the written description above, the memory module 1920 operates as a storage/buffer/etc. to accommodate all possible values of $N_{cb}^r$ and/or $N_{CB}$ referenced above, that correspond to possible block sizes in accordance with rate matching such as may be performed in accordance with any embodiment described herein or equivalent.

The memory module 1900 may be viewed as including a sufficient number of memory locations to store one LLR for each of the bits of signal for a predetermined maximum block size that may be expected. In this way, this maximally expected block size (again, excluding any consideration for pad bits) will ensure that all smaller block sizes may also be accommodated.

The memory module 1920 operates to store soft information (e.g., LLRs) associated with all coded bits transmitted from another communication device to the communication device 1900, as shown in block 1920a. As shown in a block 1920b, the memory module 1920 includes no space dedicated to accommodate any dummy, pad bits such as may be employed in accordance with encoding (e.g., the reader is referred to at least FIG. 5, FIG. 6, FIG. 8, FIG. 17, FIG. 18, etc.). As described elsewhere herein, various pad bits (e.g., zero valued fill bits, dummy bits, etc.) may be employed to effectuate rate matching in various embodiments. However, as handled appropriately and accommodated for using a rate matching module 1940, these various pad bits (e.g., zero valued fill bits, dummy bits, etc.) may be dealt with appropriately without dedicating memory locations thereto within the memory module 1920.

In the context of hybrid automatic repeat request (HARQ), where multiple transmissions may be made to transmit various sub-sets or portions of an encoded block, the memory module 1920 intelligently and selectively stores the LLRs corresponding to each of the various HARQ until a sufficient number of LLRs for an entire encoded block is assembled. When a sufficient number of LLRs is available in the memory module 1920, they are then passed (e.g., immediately in some embodiments) to a turbo decoder that employs the LLRs to makes estimates of bits encoded within the digital signal. It is of course noted that if a received signal in fact includes a sufficient number of LLRs so that decoding thereof may be performed, then the LLRs may be passed directly through the memory module 1920 to the turbo decoder 1930 at that time.

As mentioned above, the rate matching module 1940 operates to coordinate with and direct each of the demodulator 1910, the memory module 1920, and the turbo decoder 1930 to perform appropriate processing based on the rate matching operational parameters corresponding to the signal currently received and being processed. As such, at least the demodulator 1910 and the turbo decoder 1930 consider the rate matching operational parameters when processing a particular signal.

It is noted that the rate matching operational parameters may vary for different received signals, and the rate matching operational parameters may then be viewed as being dynamic (e.g., not static and fixed for all types of signals received). Some examples of such rate matching operational parameters include: a block size 1940a, a code rate 1940b, a shortening parameter 1940c, a zero padded bit parameter 1940d, a dummy bit parameter 1940e, a sub-block interleaving parameter 1940f, a starting position parameter 1940g, and/or any other rate matching parameter 1940h. Clearly, any other desired rate matching operational parameter may be employed without departing from the scope and spirit of the invention. It is noted that these rate matching operational parameters also correspond to how encoder-side/transmitter processing is performed to generate the signal that is eventually received by the communication device 1900. To ensure that appropriate decoder-side/receiver processing is performed, the rate matching operational parameters for a given signal correspond to what is performed to generate that signal within the encoder-side/transmitter processing.

It is further noted that the signal received by the communication device 1900 may be generated using any of the embodiments or equivalents described herein. For example, the reader is referred to any of the embodiments described herein that perform generation of a signal that may be transmitted via a communication channel from a first communication device to a second communication device.

Also, the memory module 1920 may be implemented to store updated LLRs as well (e.g., over-writing previously calculated values). For example, in the context of HARQ, when a subsequent transmission includes a same encoded bit that was already transmitted and received within a previous transmission, then the updated LLR corresponding thereto may be over-written in place of the previously calculated value. Moreover, certain intelligence may be implemented to compare the previously calculated LLR and the just-calculated LLR to select one of them to be stored based on some decision criterion or criteria (e.g., a criterion other than the order in which the corresponding transmissions were received).

Figure 20:
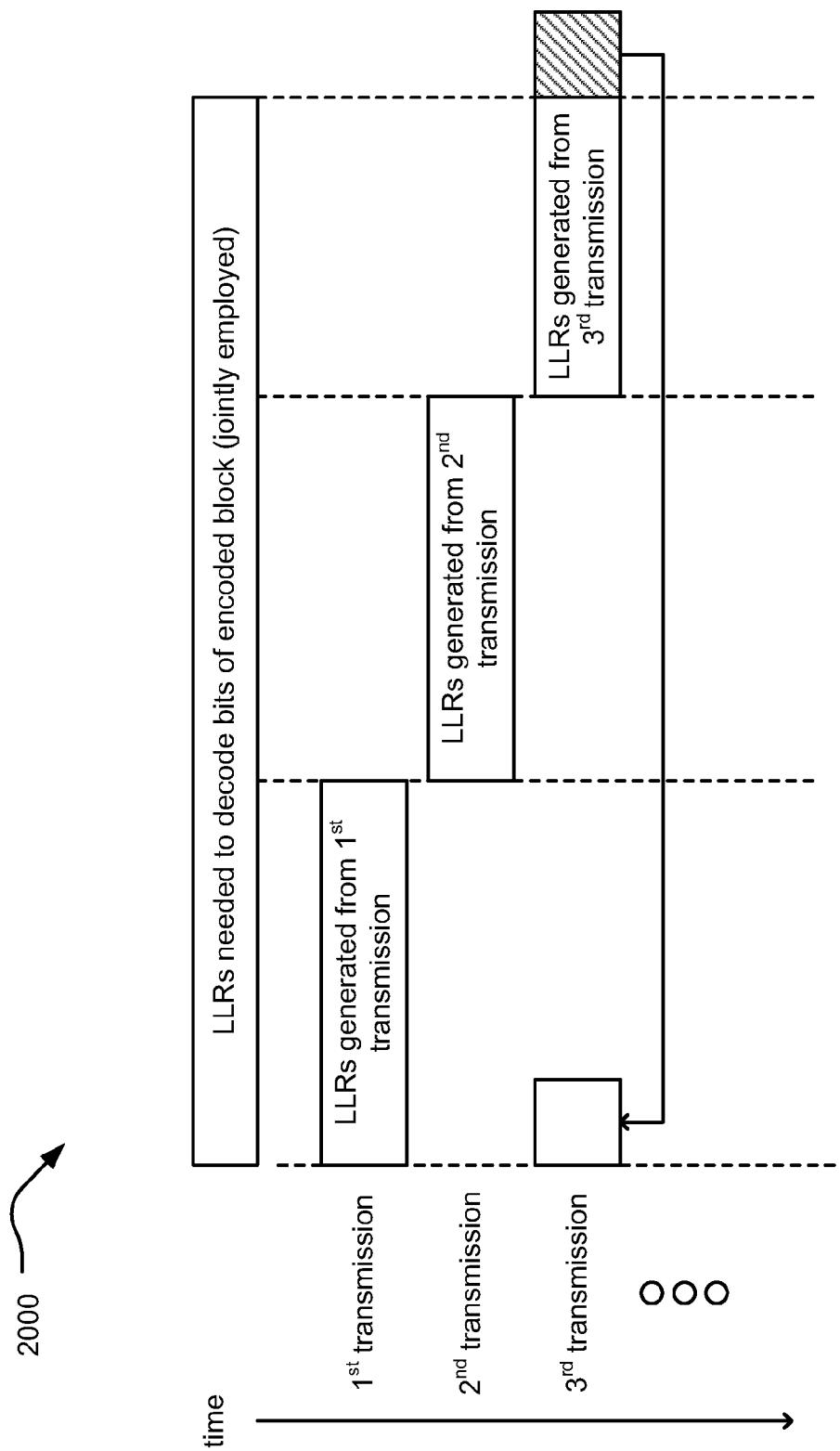
FIG. 20 illustrates an embodiment of generation of log-likelihood ratios (LLRs) from various transmissions of an encoded block.

FIG. 20 illustrates an embodiment 2000 of generation of log-likelihood ratios (LLRs) from various transmissions of an encoded block. This embodiment 2000 shows how various portions of an encoded block are transmitted in different transmissions (e.g., such as in accordance with HARQ). The reader is also referred to FIG. 7 and associated written description with respect to HARQ. As can be seen in this embodiment 1900, subsets or sub-portions of an encoded block are transmitted in various transmissions. In a communication device that receives the various transmissions, LLRs may be generated from each of a $1^{st}$ transmission, a $2^{nd}$ transmission, etc. In such an embodiment 2000, while the LLRs generated from, the $1^{st}$ transmission may be insufficient for performing decoding of the entire encoded block, after the $3^{rd}$ transmission is received (that includes some over-lapped portion with the $1^{st}$ transmission), then LLRs corresponding to all locations of the encoded block are then available.

In accordance with such an embodiment 2000, a memory module selectively and intelligently stores the LLRs associated with the $1^{st}$ transmission and a $2^{nd}$ transmission. Then, when LLRs associated with the $3^{rd}$ transmission are received, all of the LLRs may be output and provided to a turbo decoder for use in accordance with turbo decoding.

Figure 21:
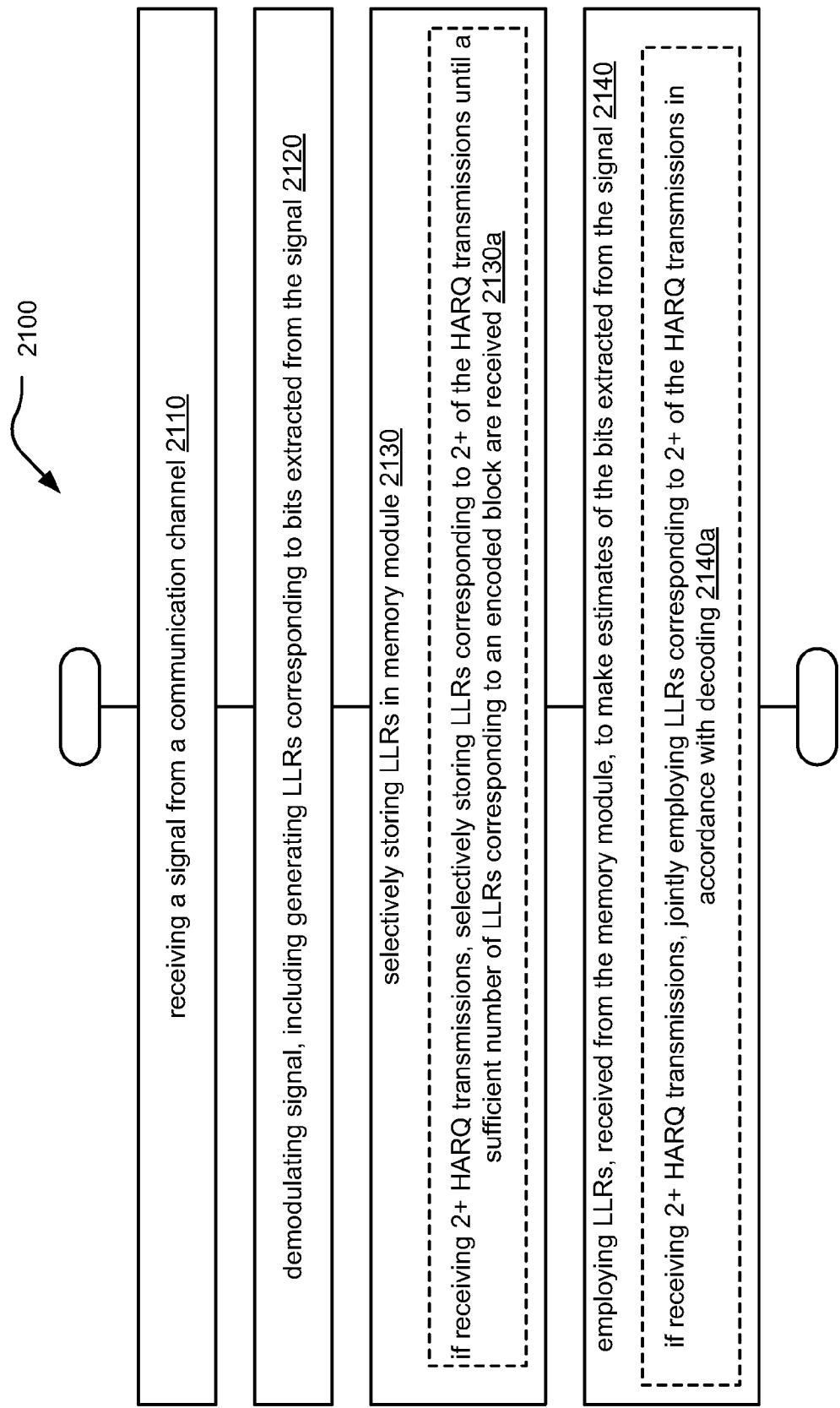
FIG. 21 illustrates an embodiment of a method for performing processing of a received signal.

FIG. 21 illustrates an embodiment of a method 2100 for performing processing of a received signal. The method 2100 operates by receiving a signal from a communication channel, as shown in a block 2110. Then, the method 2100 operates by demodulating the signal, as shown in a block 2120. This also includes generating LLRs corresponding to bits extracted from the signal.

The method 2100 then operates by selectively storing the LLRs in a memory module 2130. For example, in the context of HARQ in which 2 or more HARQ transmissions may be received, the method 2100 operates by selectively storing the LLRs corresponding to the 2 or more HARQ transmissions until a sufficient number of LLRs corresponding to an encoded block have been received so that it may undergo decoding, as shown in a block 2130a.

Then, the method 2100 operates by employing the LLRs, received from the memory module (e.g., including a sufficient number of LLRs to perform decoding of an entire encoded block), to make estimates of bits extracted from the signal, as shown in a block 2140. In the context of HARQ in which 2 or more HARQ transmissions may be received, the method 2100 operates by jointly employing LLRs corresponding to 2 or more HARQ transmissions in accordance with decoding, as shown in a block 2140a.

It is noted that any of the various modules (e.g., encoding modules, decoding modules, processing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] R1-080533, "Way forward on RV definition for LBRM," ZTE, RITT, Broadcom, CATT, Huawei, Nortel, Sevilla, Spain, Jan. 14-18, 2008, 2 pages.

[2] R1-080515, "Proposal for Limited Buffer Rate Matching," Motorola, Freescale, LGE, Marvell, Nokia, NSN, Phillips Samsung, Texas Instruments, Ericsson, 3GPP TSG RAN1#51bis, Sevilla, Spain, Jan. 14-18, 2008, 3 pages.

[3] 3GPP TS 36.306 V8.0.0 (2007-12), "3rd Generation Partnership Project; Technical Specification Group Radio Access Network; Evolved Universal Terrestrial Radio Access (E-UTRA) User Equipment (UE) radio access capabilities (Release 8)", 12-2007, 12 pages.

[4] R1-080057, "Limited Buffer Rate Matching Performance Analysis," Motorola, 3GPP TSG RAN1#51bis, Sevilla, Spain, Jan. 14-18, 2008, 15 pages.

[5] R1-080631, "Report of 3GPP TSG RAN WG1 #51bis v1.0.0, (Sevilla, Spain, 14-18 Jan. 2008)," 3GPP TSG RAN WG1 Meeting #52, Sorento, Italy, 11-15 Feb. 2008, 75 pages.

What is claimed is:

1. An apparatus, comprising:
an input to receive a plurality of signals successively from a communication channel;
a memory to store selectively a plurality of log-likelihood ratios (LLRs) corresponding to an entire turbo encoded block such that at least a first of the plurality of LLRs corresponding respectively to a first of the plurality of signals and at least a second of the plurality of LLRs corresponding respectively to a second of the plurality of signals; and
a turbo decoder to employ the plurality of LLRs corresponding to the entire turbo encoded block, selectively stored in the memory, to make a plurality of estimates corresponding to each respective encoded bit of a plurality of encoded bits of the entire turbo encoded block; and wherein:
the turbo decoder to receive all of the plurality of LLRs corresponding to the entire turbo encoded block selectively stored in the memory after a last LLR of the plurality of LLRs corresponding to the entire turbo encoded block selectively stored in the memory.

2. The apparatus of claim 1, wherein:
the memory includes only a number of memory locations to store one LLR for each respective encoded bit of the plurality of encoded bits of the entire turbo encoded block.

3. The apparatus of claim 1, further comprising:
a demodulator to process the plurality of signals, successively from the communication channel, to generate a plurality of digital signals; and wherein:
the demodulator includes a metric generator to process a first of the plurality of digital signals to calculate the at least a first of the plurality of LLRs; and
the metric generator to process a second of the plurality of digital signals to calculate the at least a second of the plurality of LLRs.

4. The apparatus of claim 1, further comprising:
an additional apparatus coupled to the apparatus via the communication channel; and wherein the additional apparatus including:
a zero padding module to pad at least one fill bit to an information block to generate a zero padded block;
a turbo encoding module to encode the zero padded block to generate a turbo coded block;
a dummy padding module to pad at least one pad bit to the turbo coded block to generate a dummy padded block;
a sub-block interleaving module to sub-block interleave the dummy padded block to generate a sub-block interleaved block; and
a circular buffer rate matching module to de-pad each fill bit and each dummy bit from the sub-block interleaved block to generate a sequence of bits for transmission to the apparatus within at least one of the plurality of signals.

5. The apparatus of claim 1, wherein:
the apparatus being a communication device operative within at least one of a satellite communication system, a wireless communication system, a wired communication system, and a fiber-optic communication system.

6. An apparatus, comprising:
an input to receive a plurality of signals successively from a communication channel;
a memory to store selectively a plurality of log-likelihood ratios (LLRs) corresponding to an entire turbo encoded block such that at least a first of the plurality of LLRs corresponding respectively to a first of the plurality of signals and at least a second of the plurality of LLRs corresponding respectively to a second of the plurality of signals; and
a turbo decoder to employ the plurality of LLRs corresponding to the entire turbo encoded block, selectively stored in the memory, to make a plurality of estimates corresponding to the entire turbo encoded block.

7. The apparatus of claim 6, wherein:
the turbo decoder to receive all of the plurality of LLRs corresponding to the entire turbo encoded block selectively stored in the memory after a last LLR of the plurality of LLRs corresponding to the entire turbo encoded block selectively stored in the memory.

8. The apparatus of claim 6, wherein:
the turbo decoder to employ the plurality of LLRs corresponding to the entire turbo encoded block, selectively stored in the memory, to make the plurality of estimates corresponding to each respective encoded bit of a plurality of encoded bits of the entire turbo encoded block.

9. The apparatus of claim 6, wherein:
the memory includes only a number of memory locations to store one LLR for each respective encoded bit of a plurality of encoded bits of the entire turbo encoded block.

10. The apparatus of claim 6, further comprising:
a demodulator to process the plurality of signals, successively from the communication channel, to generate a plurality of digital signals; and wherein:
the demodulator includes a metric generator to process a first of the plurality of digital signals to calculate the at least a first of the plurality of LLRs; and
the metric generator to process a second of the plurality of digital signals to calculate the at least a second of the plurality of LLRs.

11. The apparatus of claim 10, further comprising:
a rate matching module to indicate a plurality of rate matching operational parameters to each of the demodulator, the memory, and the turbo decoder; and wherein:
the plurality of rate matching operational parameters corresponding to at least one of the plurality of signals successively received from the communication channel;
the demodulator to consider the plurality of rate matching operational parameters in accordance with processing at least one of the plurality of signals;
the turbo decoder to consider the plurality of rate matching operational parameters to make the plurality of estimates corresponding to the entire turbo encoded block; and
at least one of the rate matching operational parameters being at least one of a block size, a code rate, a shortening parameter, a zero padded bit parameter, a dummy bit parameter, a sub-block interleaving parameter, and a starting position parameter.

12. The apparatus of claim 6, further comprising:
an additional apparatus coupled to the apparatus via the communication channel; and wherein the additional apparatus including:
a zero padding module to pad at least one fill bit to an information block to generate a zero padded block;
a turbo encoding module to encode the zero padded block to generate a turbo coded block;
a dummy padding module to pad at least one pad bit to the turbo coded block to generate a dummy padded block;
a sub-block interleaving module to sub-block interleave the dummy padded block to generate a sub-block interleaved block; and
a circular buffer rate matching module to de-pad each fill bit and each dummy bit from the sub-block interleaved block to generate a sequence of bits for transmission to the apparatus within at least one of the plurality of signals.

13. The apparatus of claim 6, wherein:
the apparatus being a communication device operative within at least one of a satellite communication system, a wireless communication system, a wired communication system, and a fiber-optic communication system.

14. A method for operating a communication device, the method comprising:
via an input of the communication device, receiving a plurality of signals successively from a communication channel;
within a memory of the communication device, selectively storing a plurality of log-likelihood ratios (LLRs) corresponding to an entire turbo encoded block such that at least a first of the plurality of LLRs corresponding respectively to a first of the plurality of signals and at least a second of the plurality of LLRs corresponding respectively to a second of the plurality of signals; and
employ the plurality of LLRs corresponding to the entire turbo encoded block, selectively stored in the memory, in accordance with turbo decoding to make a plurality of estimates corresponding to the entire turbo encoded block.

15. The method of claim 14, further comprising:
performing turbo decoding using all of the plurality of LLRs corresponding to the entire turbo encoded block selectively stored in the memory after a last LLR of the plurality of LLRs corresponding to the entire turbo encoded block selectively stored in the memory.

16. The method of claim 14, wherein:
the memory of the communication device includes only a number of memory locations to store one LLR for each respective encoded bit of a plurality of encoded bits of the entire turbo encoded block.

17. The method of claim 14, further comprising:
processing the plurality of signals, successively from the communication channel, to generate a plurality of digital signals;
processing a first of the plurality of digital signals to calculate the at least a first of the plurality of LLRs; and
processing a second of the plurality of digital signals to calculate the at least a second of the plurality of LLRs.

18. The method of claim 17, further comprising:
indicating a plurality of rate matching operational parameters corresponding to at least one of the plurality of signals successively received from the communication channel;
considering the plurality of rate matching operational parameters in accordance with processing at least one of the plurality of signals; and
considering the plurality of rate matching operational parameters in accordance with turbo decoding to make the plurality of estimates corresponding to the entire turbo encoded block, wherein at least one of the rate matching operational parameters being at least one of a block size, a code rate, a shortening parameter, a zero padded bit parameter, a dummy bit parameter, a sub-block interleaving parameter, and a starting position parameter.

19. The method of claim 14, wherein:
an additional communication device coupled to the communication device via the communication channel; and
the additional communication device including:
  a zero padding module to pad at least one fill bit to an information block to generate a zero padded block;
  a turbo encoding module to encode the zero padded block to generate a turbo coded block;
  a dummy padding module to pad at least one pad bit to the turbo coded block to generate a dummy padded block;
  a sub-block interleaving module to sub-block interleave the dummy padded block to generate a sub-block interleaved block; and
  a circular buffer rate matching module to de-pad each fill bit and each dummy bit from the sub-block interleaved block to generate a sequence of bits for transmission to the communication device within at least one of the plurality of signals.

20. The method of claim 14, wherein:
the communication device operative within at least one of a satellite communication system, a wireless communication system, a wired communication system, and a fiber-optic communication system.

\* \* \* \* \*